United States Patent
Krupezevic et al.

(10) Patent No.: US 6,507,733 B1
(45) Date of Patent: Jan. 14, 2003

(54) THREE PORT JUNCTION RECEIVER

(75) Inventors: Dragan Krupezevic, Stuttgart (DE); Veselin Brankovic, Fellbach (DE); Masayoshi Abe, Kanagawa (JP); Tino Konschak, Stuttgart (DE); Thomas Dölle, Stuttgart (DE)

(73) Assignee: Sony International (Europe) GmbH, Berlin (DE)

( * ) Notice: Subject to any disclaimer, the term of this patent is extended or adjusted under 35 U.S.C. 154(b) by 0 days.

(21) Appl. No.: 09/461,794

(22) Filed: Dec. 15, 1999

(30) Foreign Application Priority Data

Dec. 18, 1998 (EP) .............................. 98124132

(51) Int. Cl.⁷ ................................ H04B 1/26
(52) U.S. Cl. ................... 455/324; 455/318; 455/334
(58) Field of Search ..................... 455/324, 293, 455/334, 338, 67.4, 318, 196.1, 326, 337; 375/316; 333/109, 117, 128, 100; 330/52

(56) References Cited

U.S. PATENT DOCUMENTS

| | | | |
|---|---|---|---|
| 4,450,418 A | 5/1984 | Yum et al. ................ 333/128 |
| 4,947,143 A | 8/1990 | Abouzahra et al. ....... 333/125 |
| 4,987,374 A | 1/1991 | Burke ........................ 329/302 |
| 5,313,657 A | 5/1994 | Sakamoto et al. ....... 455/67.4 |
| 5,430,418 A | 7/1995 | Blodgett .................... 330/100 |
| 5,444,418 A | 8/1995 | Mitzlaff ........................ 330/52 |
| 5,493,252 A | 2/1996 | Takai ............................. 330/52 |
| 5,635,870 A | 6/1997 | David ............................ 330/52 |
| 5,903,827 A | 5/1999 | Kennan et al. ............. 455/326 |
| 6,192,225 B1 | 2/2001 | Arpaia et al. ............ 455/196.1 |
| 2002/0009161 A1 | 1/2002 | Krupezevic et al. ........ 375/316 |

FOREIGN PATENT DOCUMENTS

| | | | |
|---|---|---|---|
| EP | 0 219 991 | 4/1987 | |
| EP | 0 805 561 | 11/1997 | |
| EP | 0 884 836 | 12/1998 | |
| GB | 2294169 A | 4/1996 | ............ H03D/7/00 |
| GB | 2294169 | * 4/1996 | ............ H03C/7/00 |
| GB | 0884836 A | 12/1998 | ............ H03D/3/00 |

* cited by examiner

Primary Examiner—Thanh Cong Le
Assistant Examiner—C. Chow
(74) Attorney, Agent, or Firm—Frommer Lawrence & Haug LLP; William S. Frommer

(57) ABSTRACT

The present invention proposes a direct receiver technique based on one power measurement and time multiplexing of input signals. The proposed technique allows I/Q demodulation. The proposed technique bases on the passive linear three-port high frequency circuitry (1) having two RF signal input (2, 5) and one output port (3) attached to a power sensor (4). The signals output from the power sensor (4) is low pass filtered (17) and supplied to a DC interface. The proposed linear three-port circuitry (1) contains at least one RF switch and at least one passive circuit having at least one phase shifter functionality.

32 Claims, 24 Drawing Sheets

Port 1 — Three Port Junction — Port 2, Port 3

Port 1 (S1), Port 2 (S2), Port 1 and Port 2 are isolated, Port 3

$S2/A\, e^{(j\phi_1)} + S1/B\, e^{(j\phi_2)}$,
$\phi_1$ and or $\phi_2$ can be zero,
A, B are real numbers Port 1 (S1), R2, Zc, R1, Port 2 (S2)

Port 3
$S1/A + S2/B$
$A = (Zc+R1)/Zc$
$B = (Zc+R2)/Zc$

Port 1 and Port 2 are isolated
$R1 \ast R2 = Zc^2$
Zc is resistive input Load on all ports (usually 50 Ohm)

Figure 16:
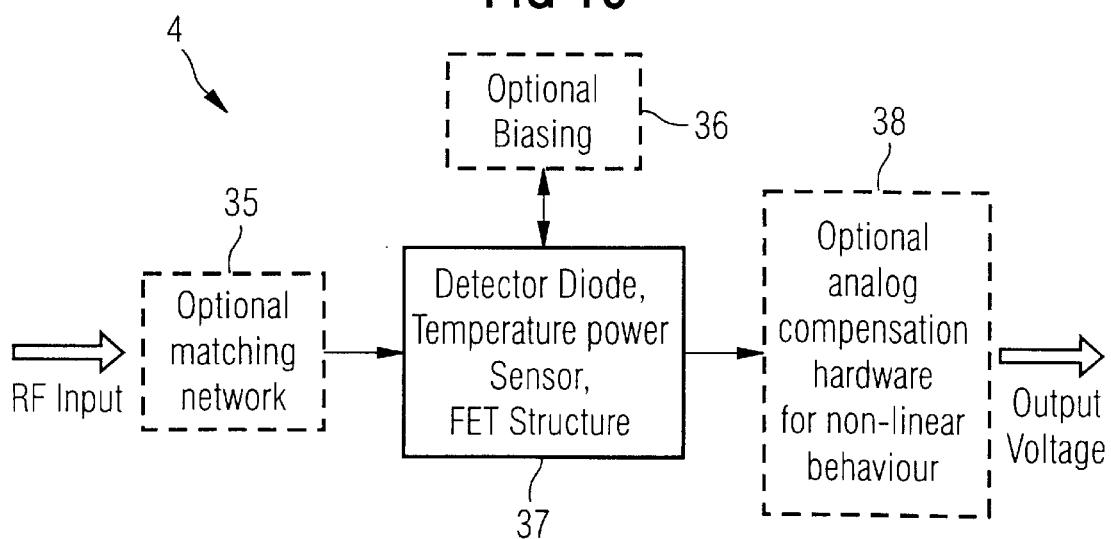
Figure 17:
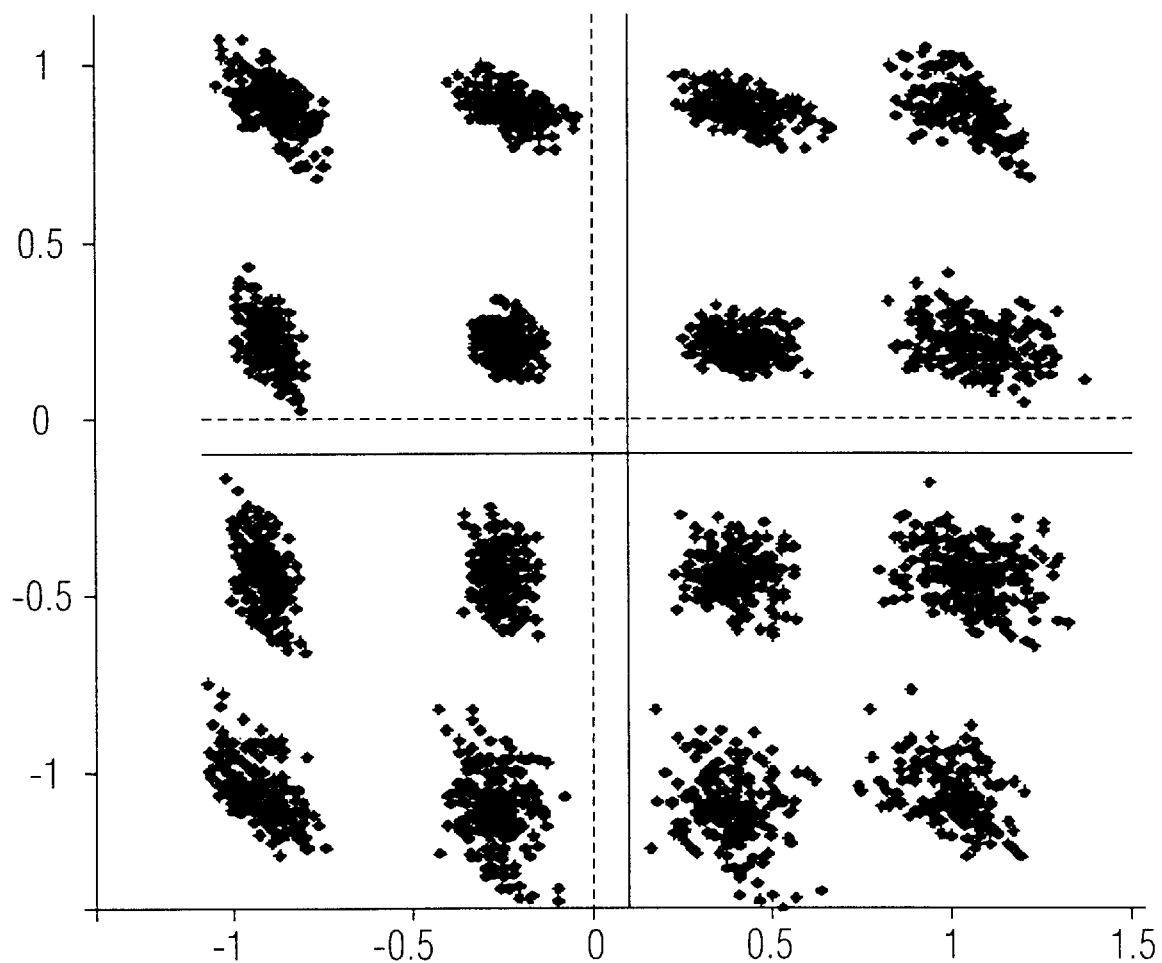
Figure 18:
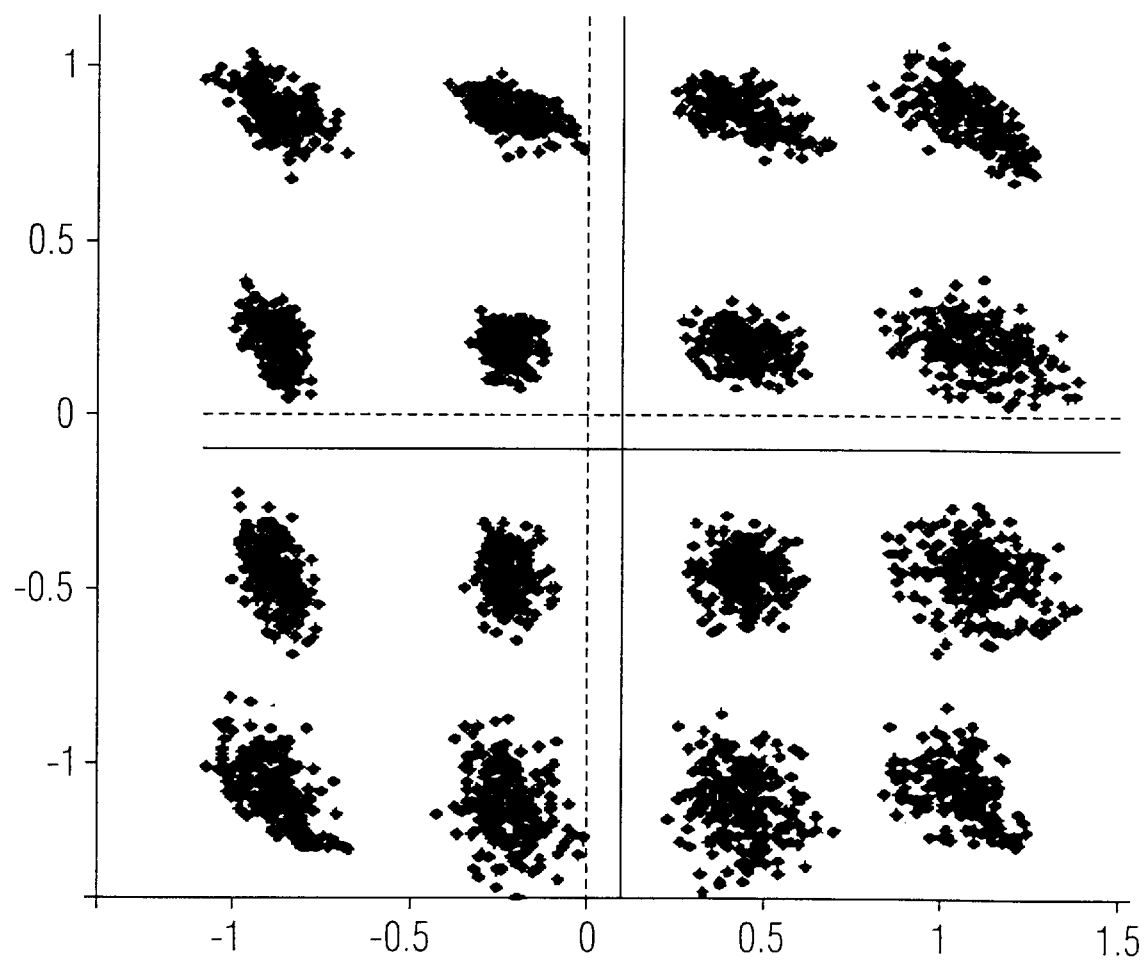
Figure 19:
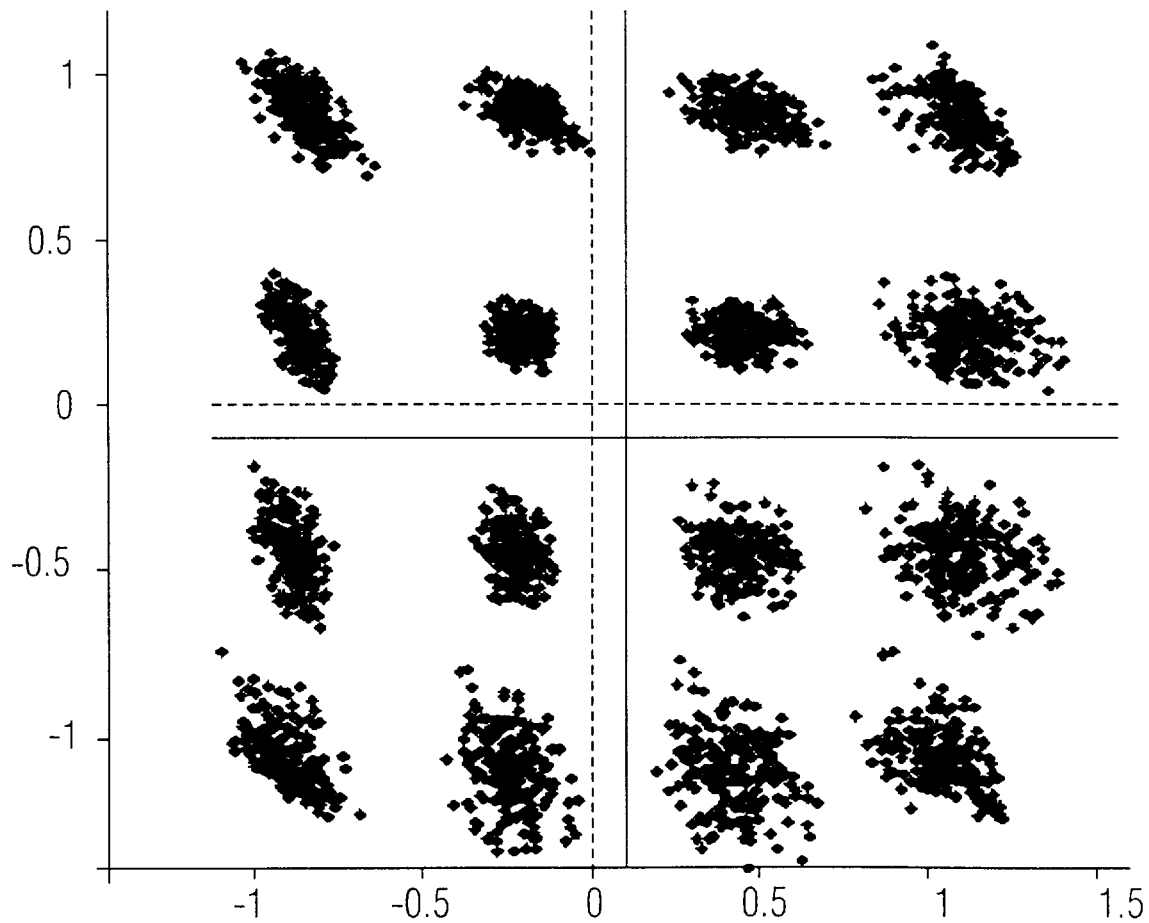
Figure 20:
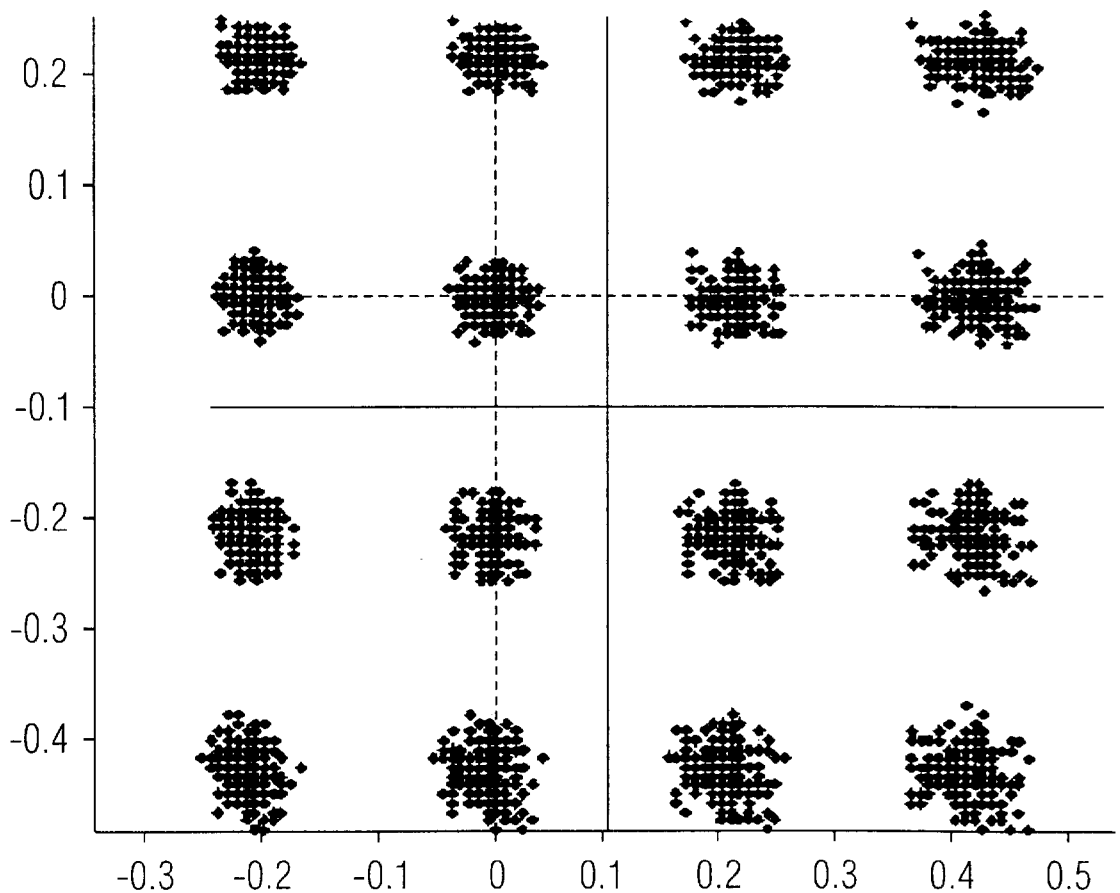
Figure 21:
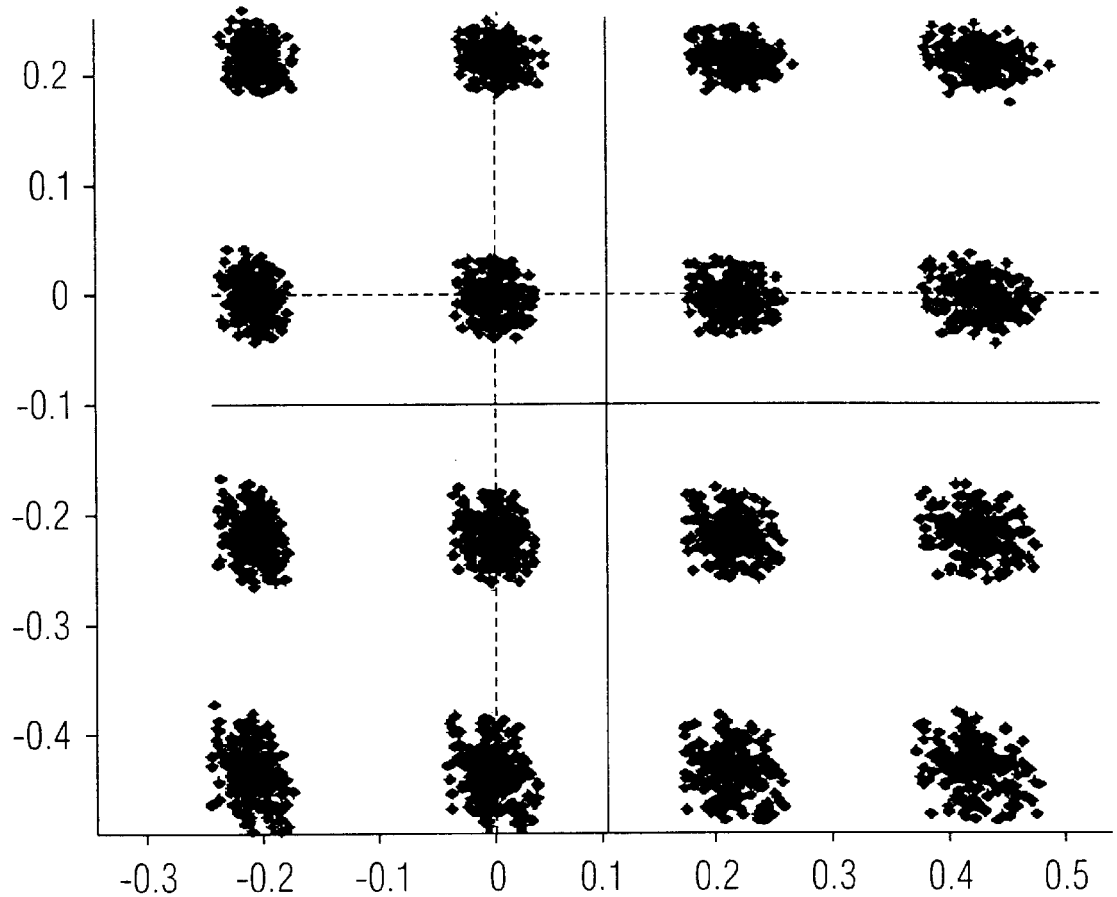
Figure 22:
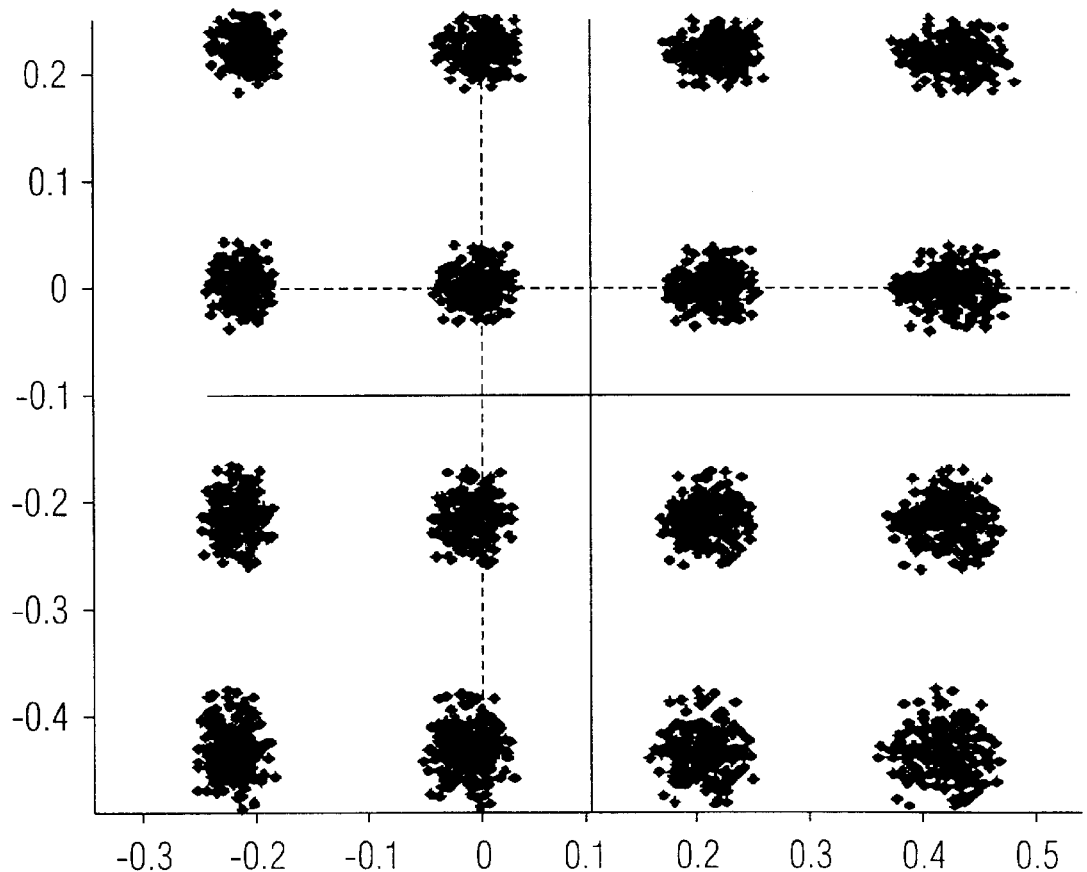
Figure 23:
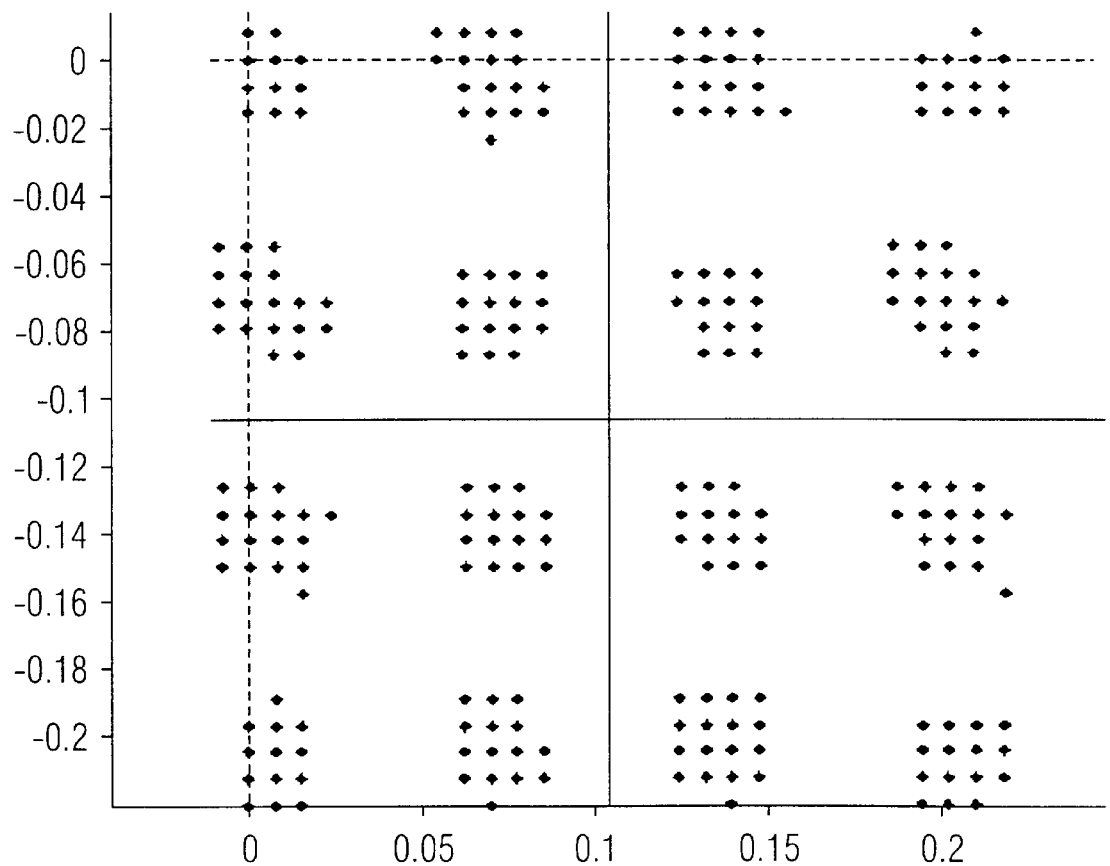
Figure 24:
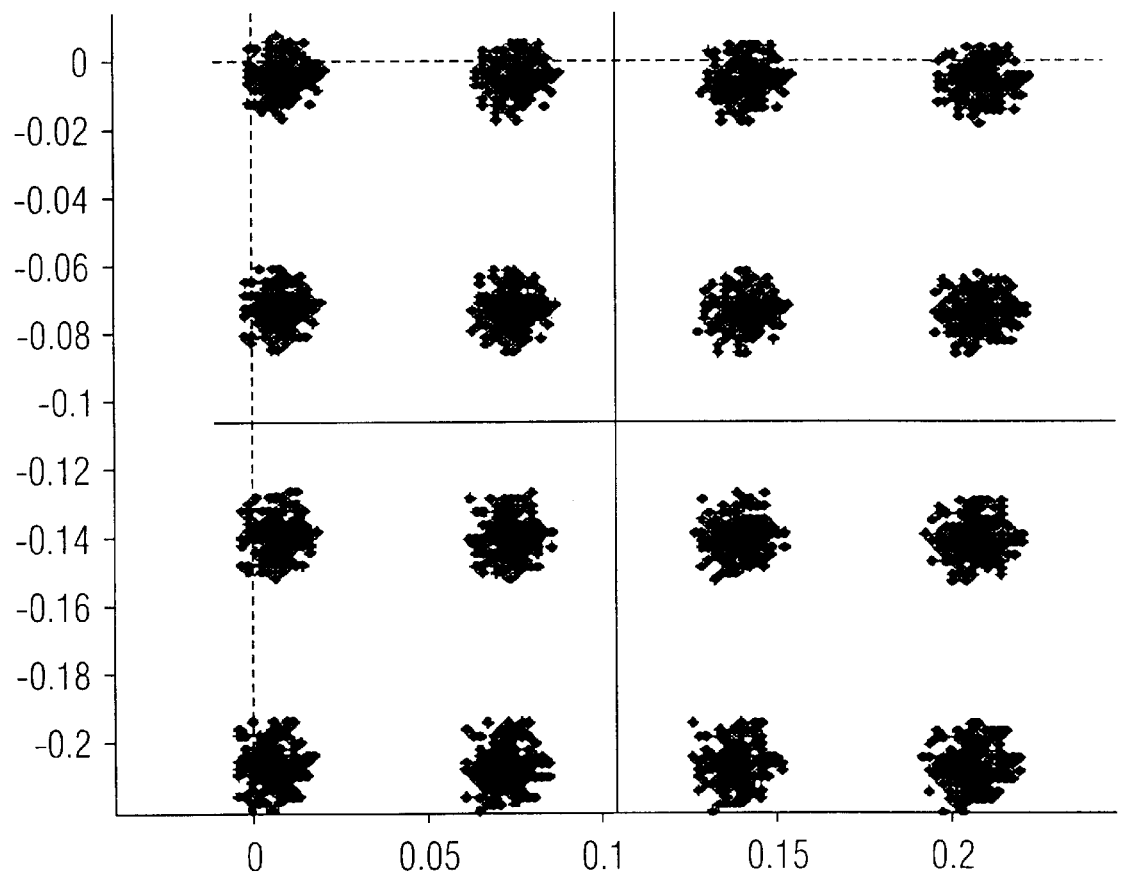
Figure 25:
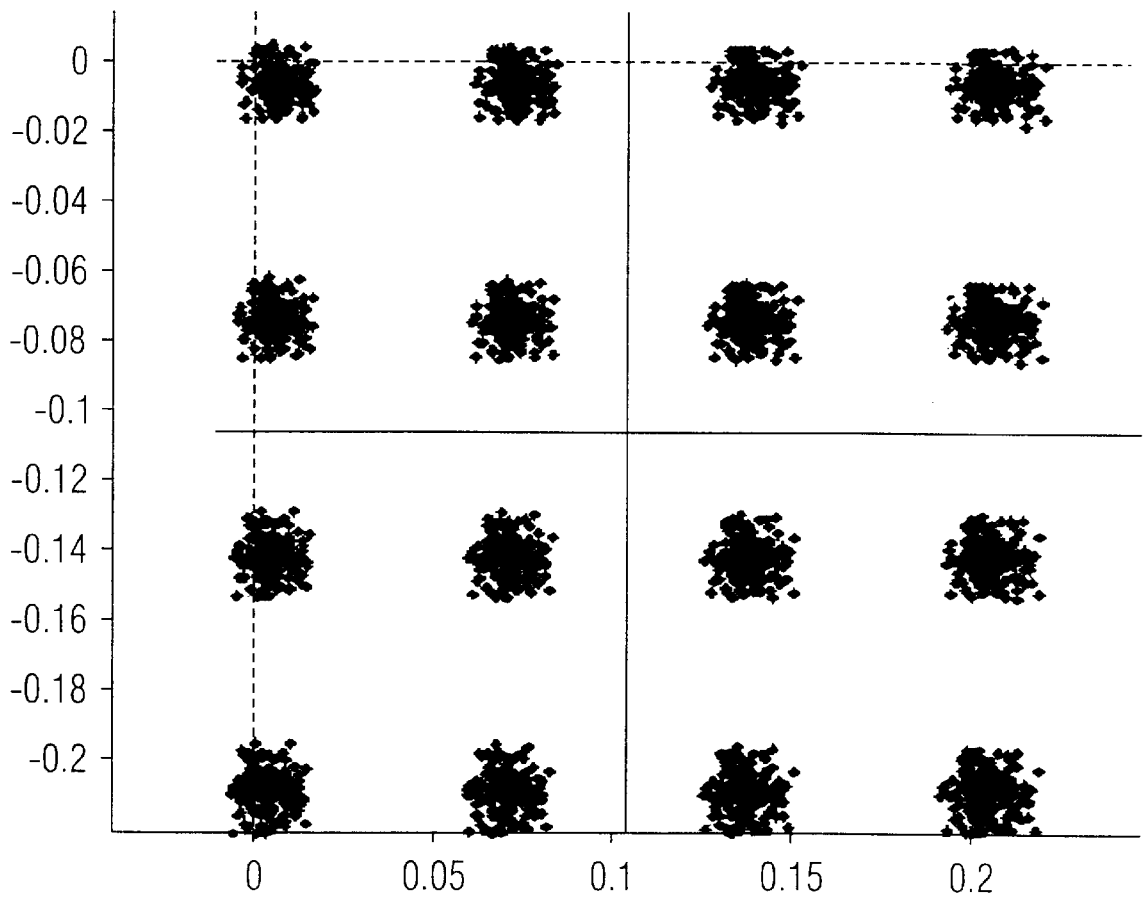

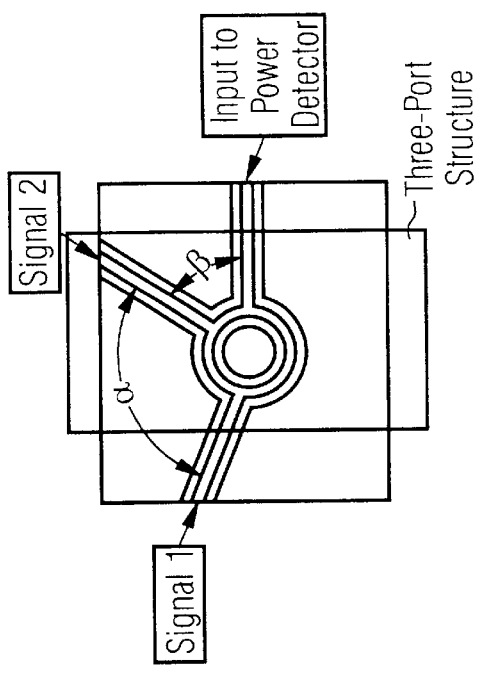
FIG 14e
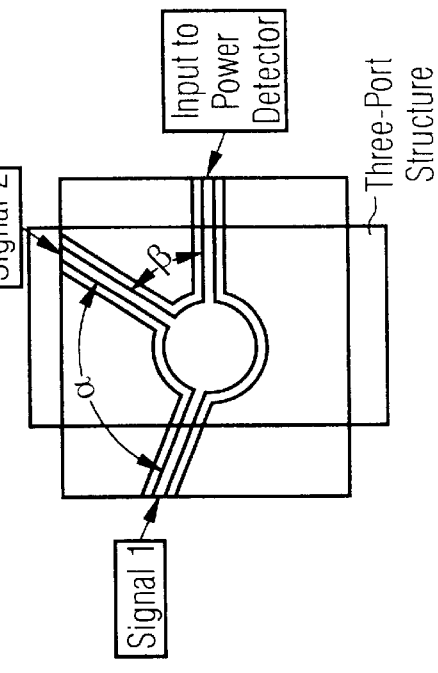
FIG 14f
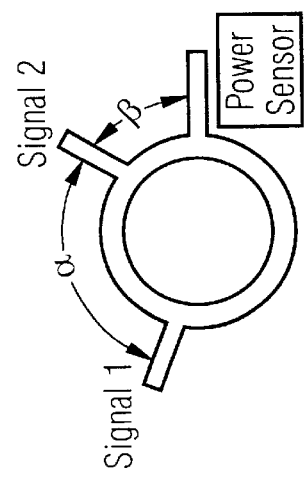
FIG 14c
FIG 14d
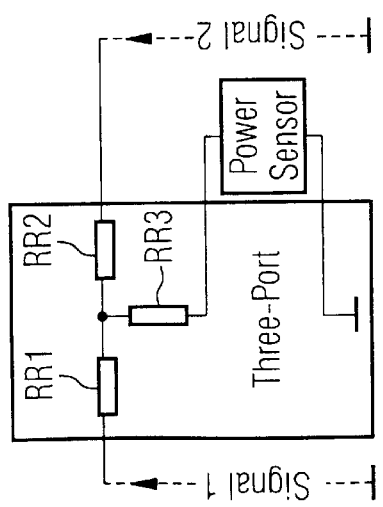
FIG 14a
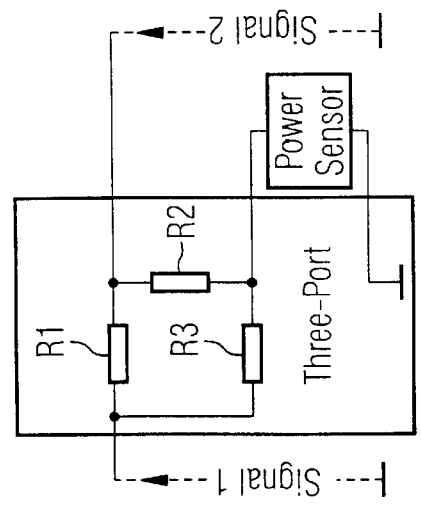
FIG 14b 16 QAM, 200 events, 8 bit ADC, S/N=18 dB, $P_{RF}=P_{LO}$ 16 QAM, 200 events, 10 bit ADC, S/N=18 dB, $P_{RF}=P_{LO}$ 16 QAM, 200 events, 12 bit ADC, S/N=18 dB, $P_{RF}=P_{LO}$ 16 QAM, 200 events, 8 bit ADC, S/N=18 dB, $P_{RF}=P_{LO}-10dB$ 16 QAM, 200 events, 10 bit ADC, S/N=18 dB, $P_{RF}=P_{LO}-10dB$ 16 QAM, 200 events, 12 bit ADC, S/N=18 dB, $P_{RF}=P_{LO}-10dB$ 16 QAM, 200 events, 8 bit ADC, S/N=18 dB, $P_{RF}=P_{LO}-20dB$ 16 QAM, 200 events, 10 bit ADC, S/N=18 dB, $P_{RF}=P_{LO}-20dB$ 16 QAM, 200 events, 12 bit ADC, S/N=18 dB, $P_{RF}=P_{LO}-20dB$

THREE PORT JUNCTION RECEIVER

The present invention relates to a three-port junction receiver acting as a direct receiver, a receiving method, a calibration method for a three-port junction device as well as a telecommunications device comprising such a receiver.

From the state of the art the six-port technology is known, which has been used up to recent years for complex measurements and can also be utilized for the reception and detection of RF-signals. Said technique is generally described, for example, in EP-A-0 805 561. A six-port receiver acts in the direct conversion manner allowing conversion from mm-wave range and microwave range directly to the baseband. At the same time a classic I/Q demodulation chip (digital or analog) can be avoided. By using suitable calibration procedures the influences of the non-ideal passive RF components including manufacturing tolerances can be minimized. The six-port receiver detects the relative phase and the relative magnitude of two incoming RF signals. The circuitry of the six-port receiver is realized using only passive components in combination with diodes for the detection of the relative phase and the relative magnitude of the RF signals. An important feature of six-port receivers is that fabrication tolerances can compensated for by a calibration, which inherently allows low-cost production. A further example for a six-port receiver is proposed in Bossisio, Wu "A six-port direct digital mm-wave receiver", Digest of 1994, IEEE MTT symposium, Vol.3, p. 1659–1662, San Diego, May 1994.

The main feature of the six-port receiver is that it performs a detection of the vector ratio between two incoming vector signals by means of a power sensing device.

The disadvantage of the six-port technology, however, is that it requires four power sensors and complicated calibration procedures.

Therefore, it is the object of the present invention to provide a technique which, is as effective as the six-port technique, but which can be implemented in a less complicated way and requires only a simplified calibration procedure.

Said object of the invention is achieved by means of the features of the independent claims. The dependent claims develop further the central idea of the invention.

According to the present invention a direct receiver for digital modulated RF-signals is provided, wherein the direct receiver comprises only one passive three-port circuitry. A first port of the passive three-port circuitry thereby is supplied with a received digital RF signal. A second port of the passive three-port circuitry is connected to a power sensor, wherein the power sensor generates an output signal which can be further processed after DC filtering. Input selection means are provided for inputting one of a plurality of predetermined signals to a third port of the passive three-port circuitry.

A local oscillator is provided being selectively connectable with a third port of the passive three-port circuitry by means of the input selection means.

The input selection means can be a switch selectively connecting an output signal of the local oscillator or a ground potential with the third port of the passive three-port circuitry.

The switch can have three switching positions, wherein in a first position a first output of the local oscillator is connected with a third port of the passive three-port circuitry, in a second position a second output the second output of the local oscillator is connected with a third port of the passive three-port circuitry, and in a third switching position said ground potential is connected to the third port of the passive three-port circuitry. At least one LO output is phase-shifted before being supplied to the RF switch. Thereby the second output of the local oscillator is phase shifted by at least one phase shifting means relatively to the first output of the local oscillator.

A termination resistor is connected to ground in one switching position.

The switch can have a maximum switching frequency such that it is adapted to switch at least three times per state duration (duration of a modulation bit) of the received digital modulated RF signal.

A second switch can be provided for routing an output of the local oscillator to one or more of a plurality of phase shifters, wherein each of said plurality of phase shifters provides for a different phase shift amount.

The second switch thereby has a maximum shifting frequency such that it is adapted to switch at least two times per modulation state duration (duration of a modulation bit) of the received digital modulated RF signal.

The detection time of the power sensor is less than one third of the state duration (duration of a modulation bit) of the received digital modulated RF signal.

The output of the power sensor is supplied to the DC interface after being DC filtered. The analog processing board is attached to the DC interface. Alternatively a fast A/D converter is attached to the DC interface.

A DC switch can be connected between the power sensor and the plurality of delay lines, wherein the switching of the DC switch is effected synchronously to the switching of the first mentioned switch.

The output of the power sensor is supplied by means of at least one A/D converter to a digital processing unit detecting the IQ components of the received digital modulated RF signal.

The conversion rate of the A/D converter is at least three times higher than the inverse of a modulation state duration (duration of a modulation bit) of the received digital modulated RF signal.

The passive three-port circuitry can be implemented by a plurality of technologies, e.g. by resistors, by a microstrip technology or a coplanar waveguide technology.

A low-pass filter is provided between the output side of the power sensor and the DC interface.

According to the present invention a mobile communications device is provided comprising a direct receiver as set forth. The mobile communications device particularly can be a mobile terminal of a private or public telecommunications network.

According to the present invention furthermore a method for calibrating a direct receiver with the features as set forth above is provided, wherein a RF signal modulated with a predefined known sequence is fed through the first port of the passive three-port circuitry.

According to another aspect of the present invention a method for directly receiving digital modulated RF signals is provided. A digital modulated RF signal is supplied to a first port of a passive three-port circuitry. The power level of a second port of the passive three-port circuitry is detected to generate an output signal, which can be further processed for example to detect I/Q components. One of a plurality of predetermined signals is selectively input to a third port of the passive three-port circuitry.

The step of selectively inputting can comprise the step of selectively inputting an output of a local oscillator to the third port of the passive three-port circuitry.

The step of selectively inputting can comprise the steps of inputting an output signal of the local oscillator and a step of supplying a ground potential to the third port of the passive three-port circuitry.

The step of selectively inputting can comprise particularly in a time-multiplex manner the following steps:
a) supplying said ground potential to the third port of the passive three-port circuitry,
b) inputting a first output of the first output of the local oscillator to the third port of the passive three-port circuitry, and
c) inputting a second output of the local oscillator to the third port of the passive three-port circuitry, wherein the second output of the local oscillator is phase shifted relatively to the first output of the local oscillator.

Respectively one sequence of the above-mentioned steps a), b) and c) is effected per state duration of the received digital modulated RF signal. Note that the order of the above steps can set arbitrarily and can be modified from time to time.

The detection time of the power sensor is less than one third of the state duration (duration of a modulation bit) of the received digital modulated RF signal.

The output of the power sensor is processed in an analog manner to detect the I/Q components of the received digital modulated RF signal.

The output of the power sensor can be supplied to the analog processing selectively with a predetermined delay out of a number of predefined delays in a time multiplex manner.

The predetermined delay can be changed synchronously to the step of selectively inputting one of a plurality of predetermined signals to a third port of the passive three-port circuitry.

The output of a power sensor can be low-pass filtered and A/D converted and digitally processed to detect the I/Q components of the received digital modulated RF signal (or can be directly digitally processed to obtain the modulation states).

The A/D conversion (sampling) speed of the direct digital processing is three times faster compared to the speed of a A/D converter in the case of a classical analog I/Q demodulator.

The detected power level is low-pass filtered.

Further advantages, features and effects of the present invention will come clearer from the following description of embodiments taking in conjunction with the figures to the enclosed drawings.

In the figures of the drawings the same reference signs are used for the identical or equivalent parts.

Figure 1:
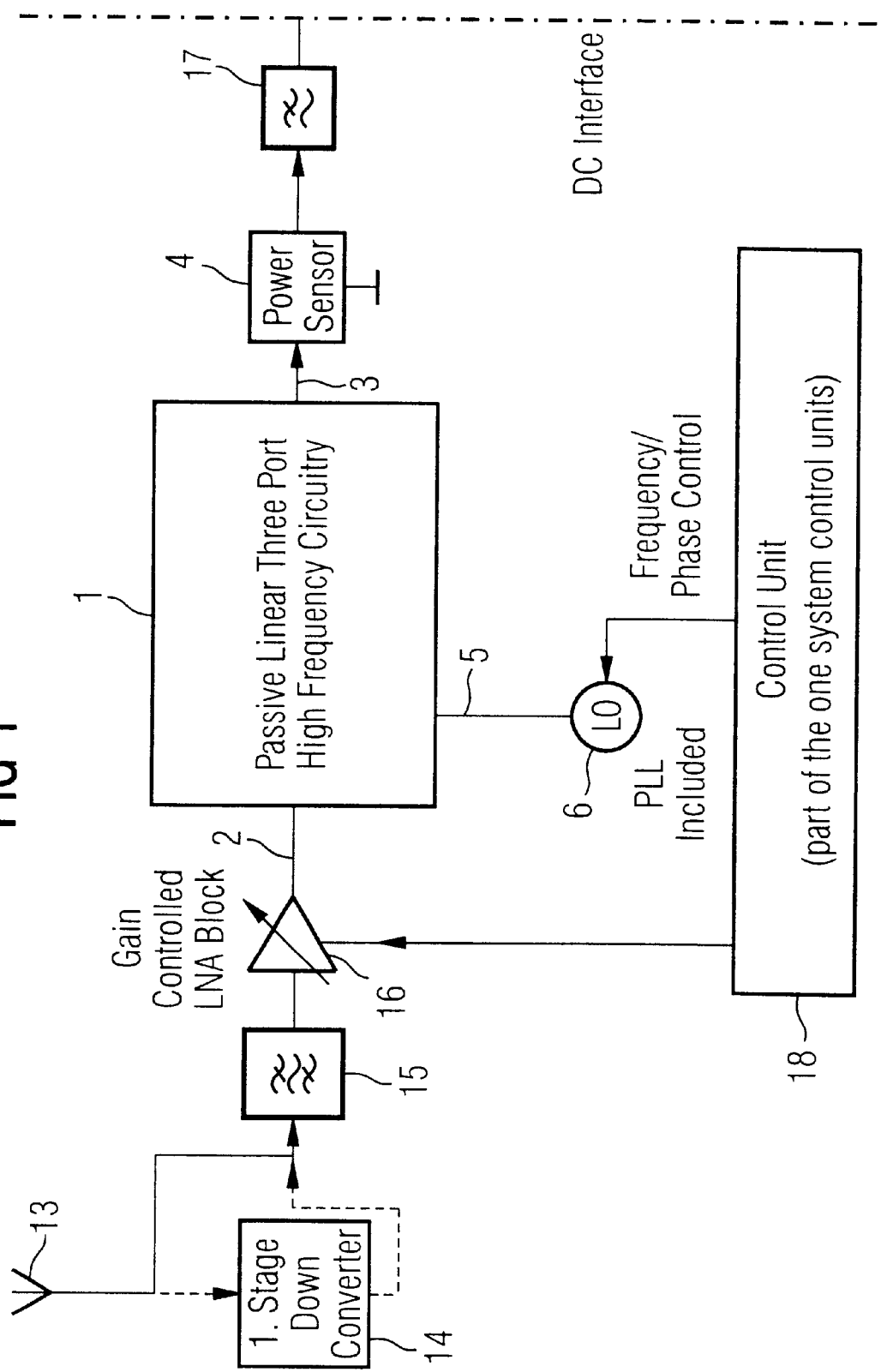
Figure 2:
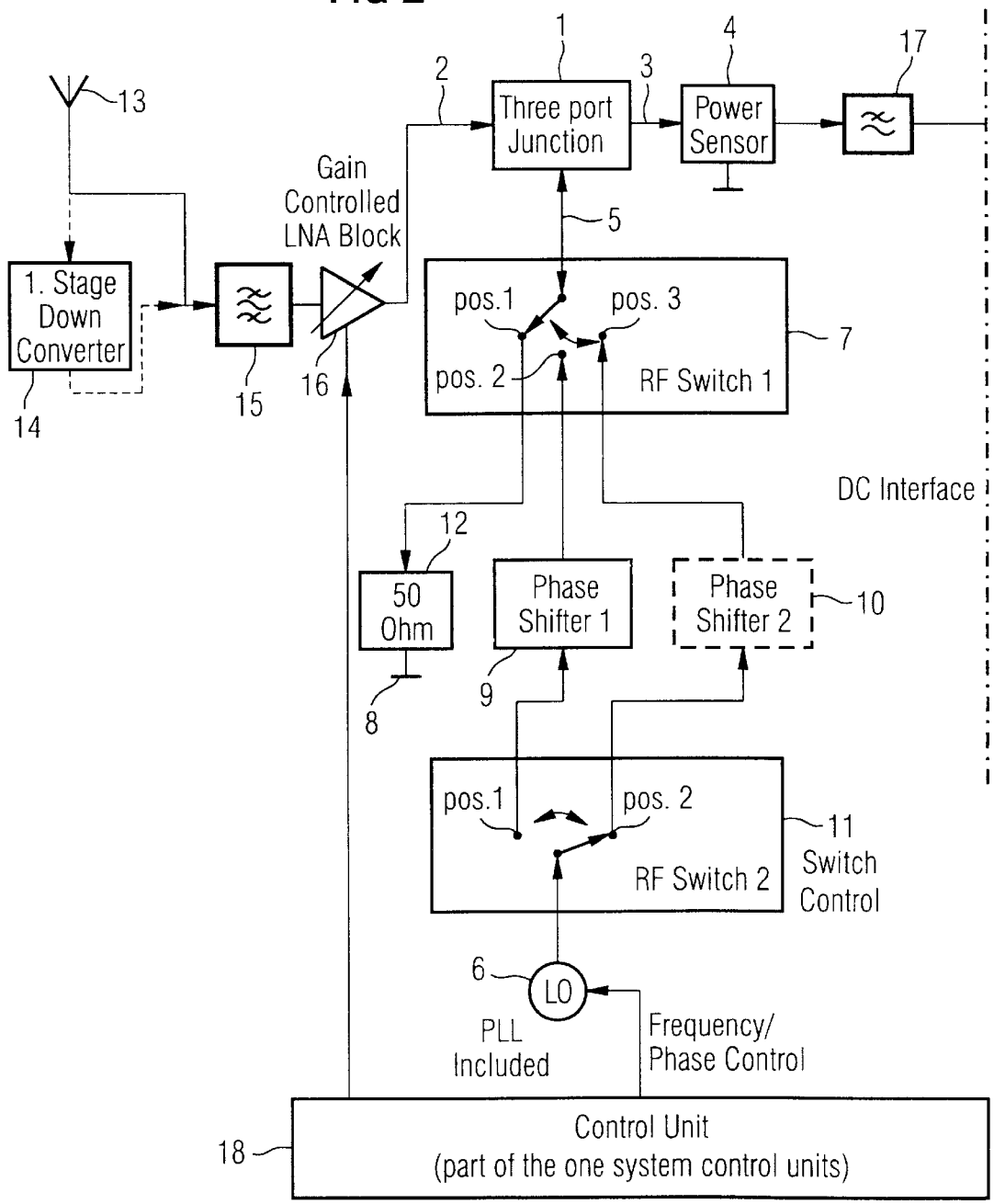
Figure 3:
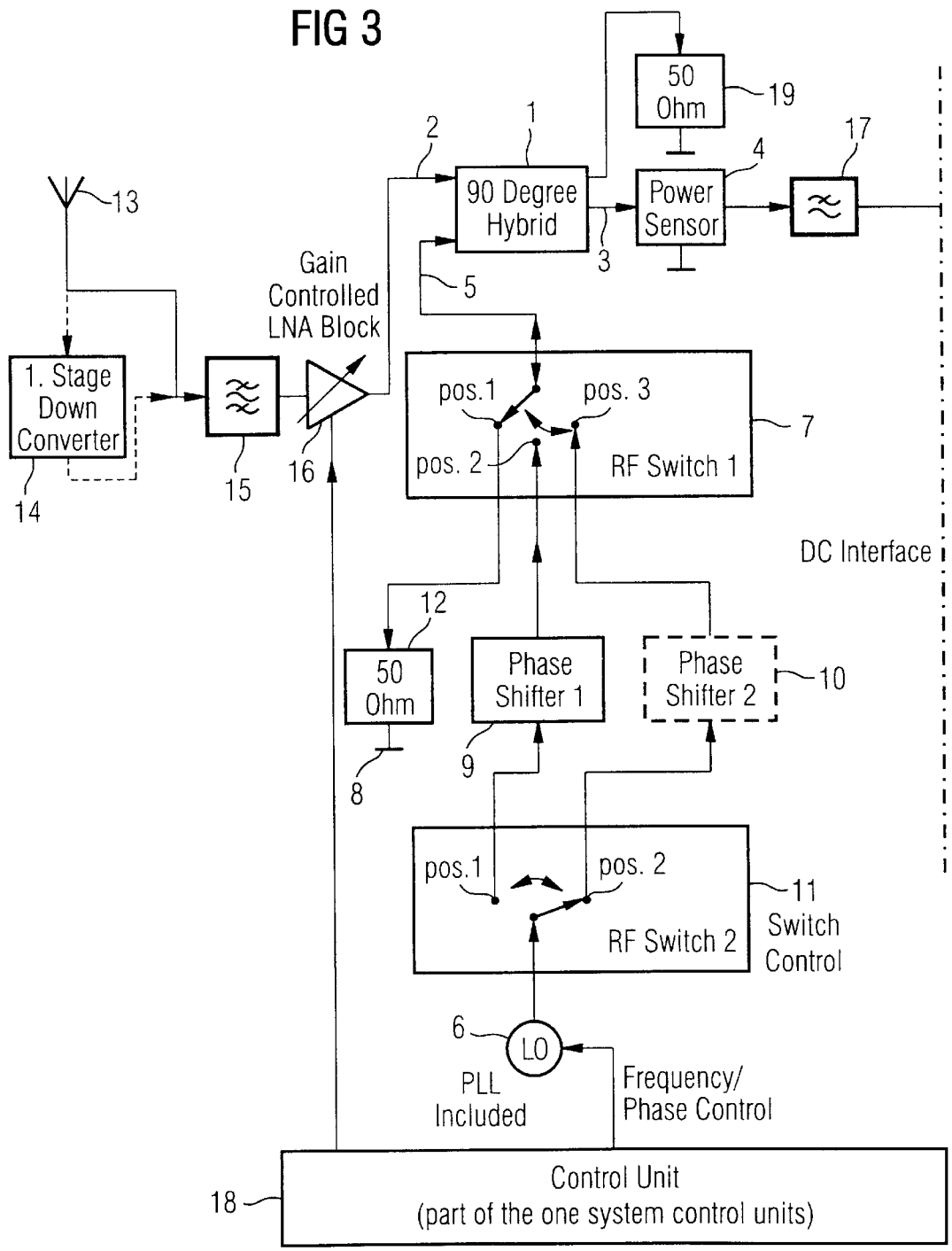
Figure 4:
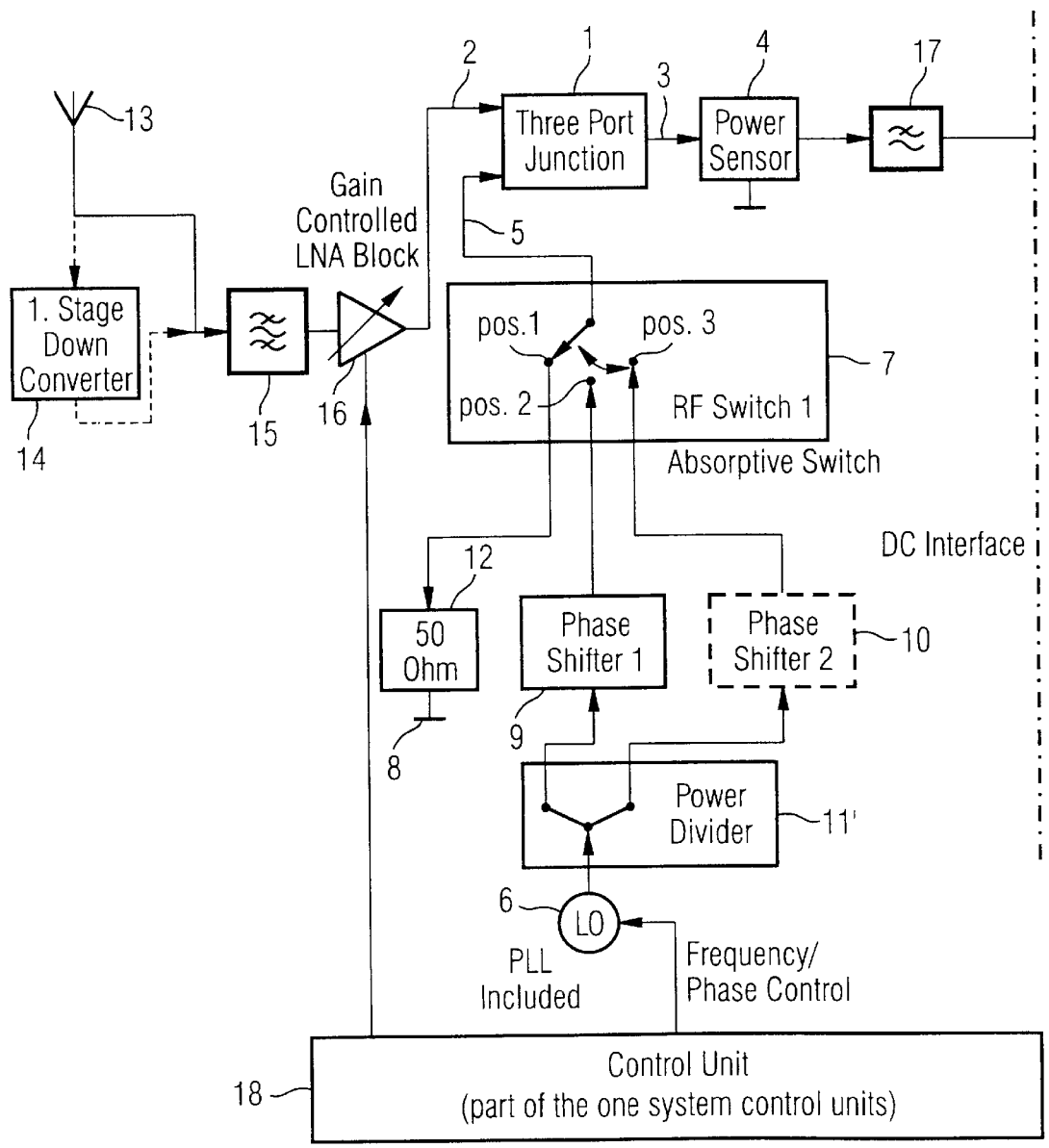
Figure 5:
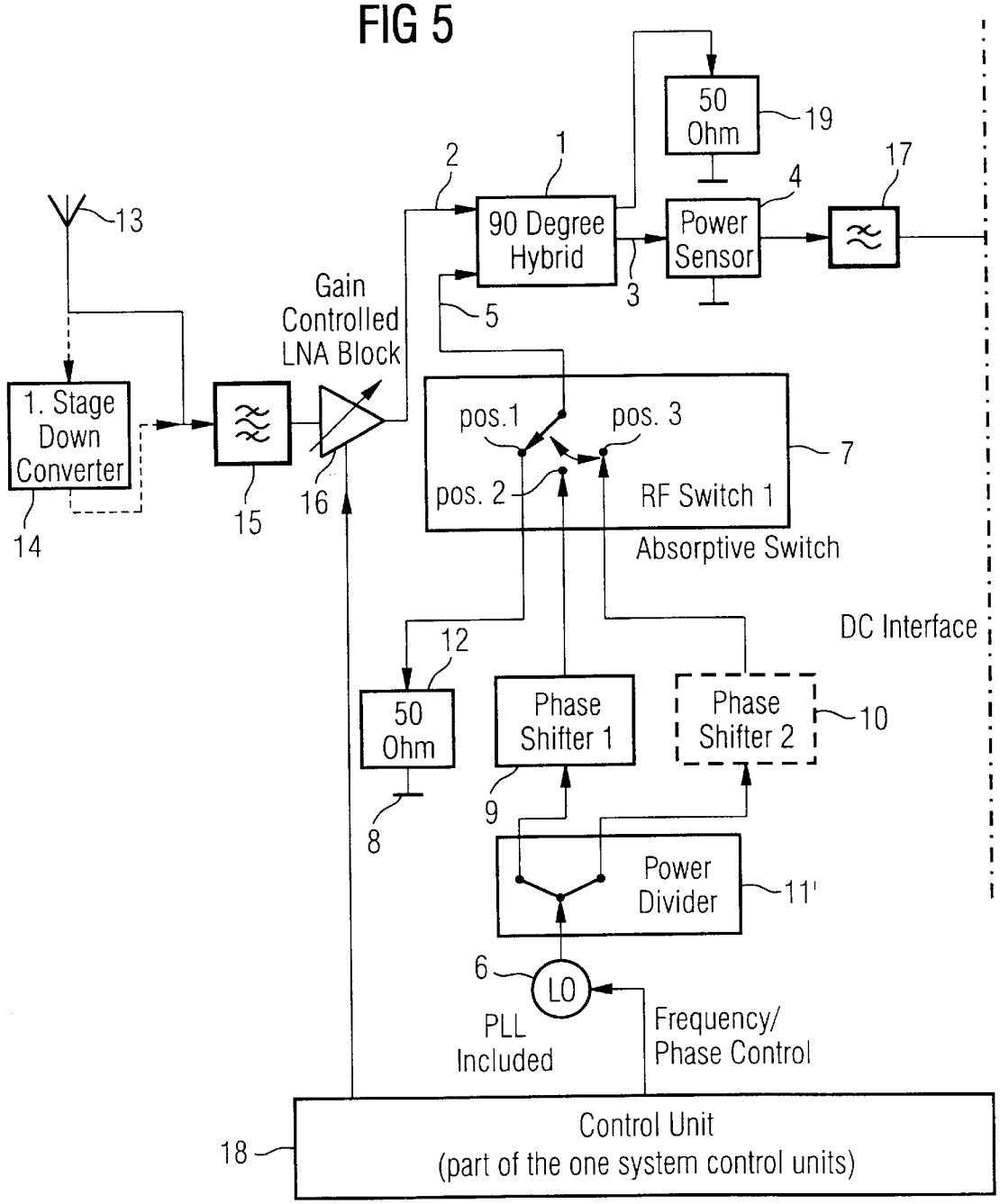
Figure 6:
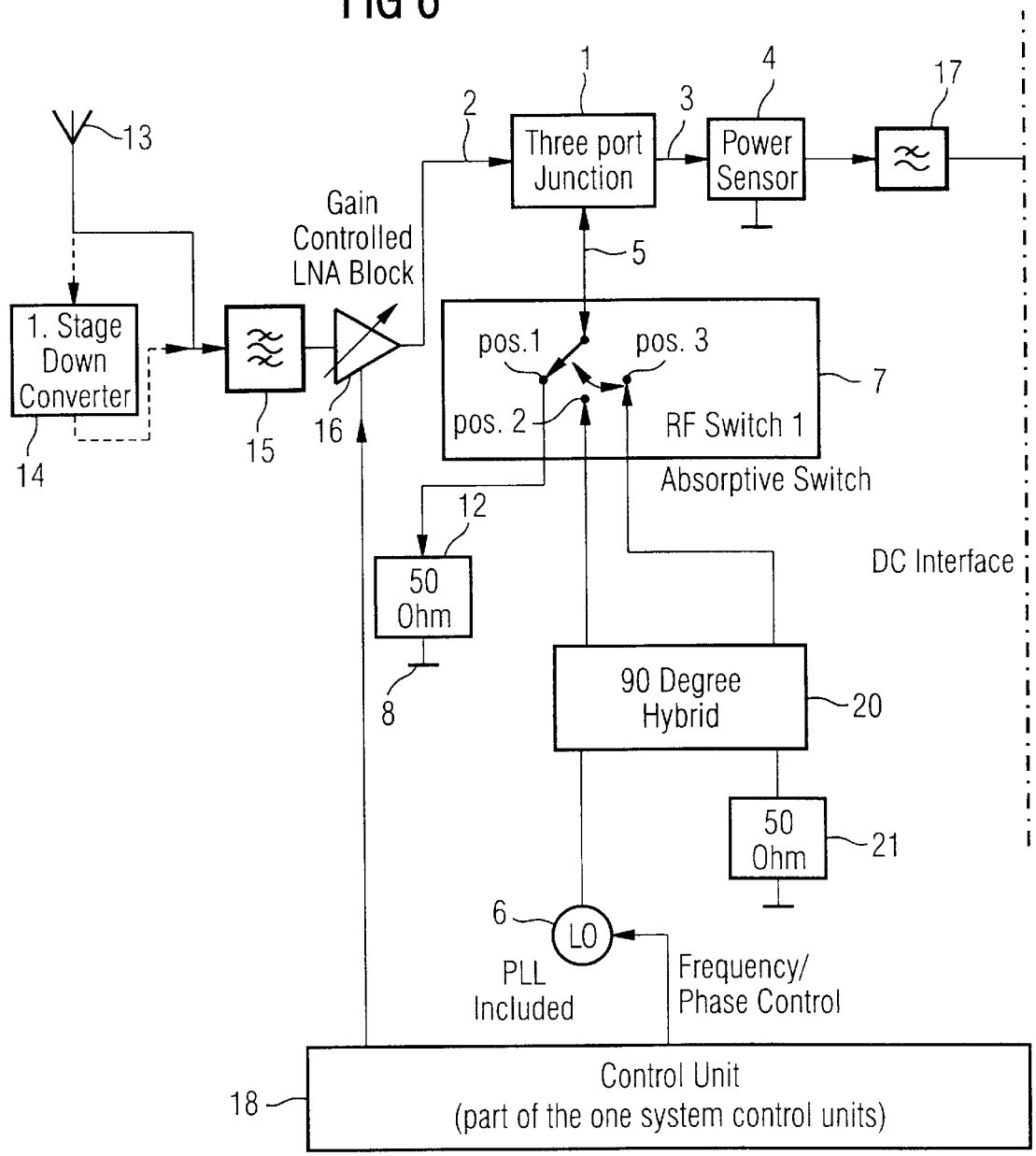
Figure 7:
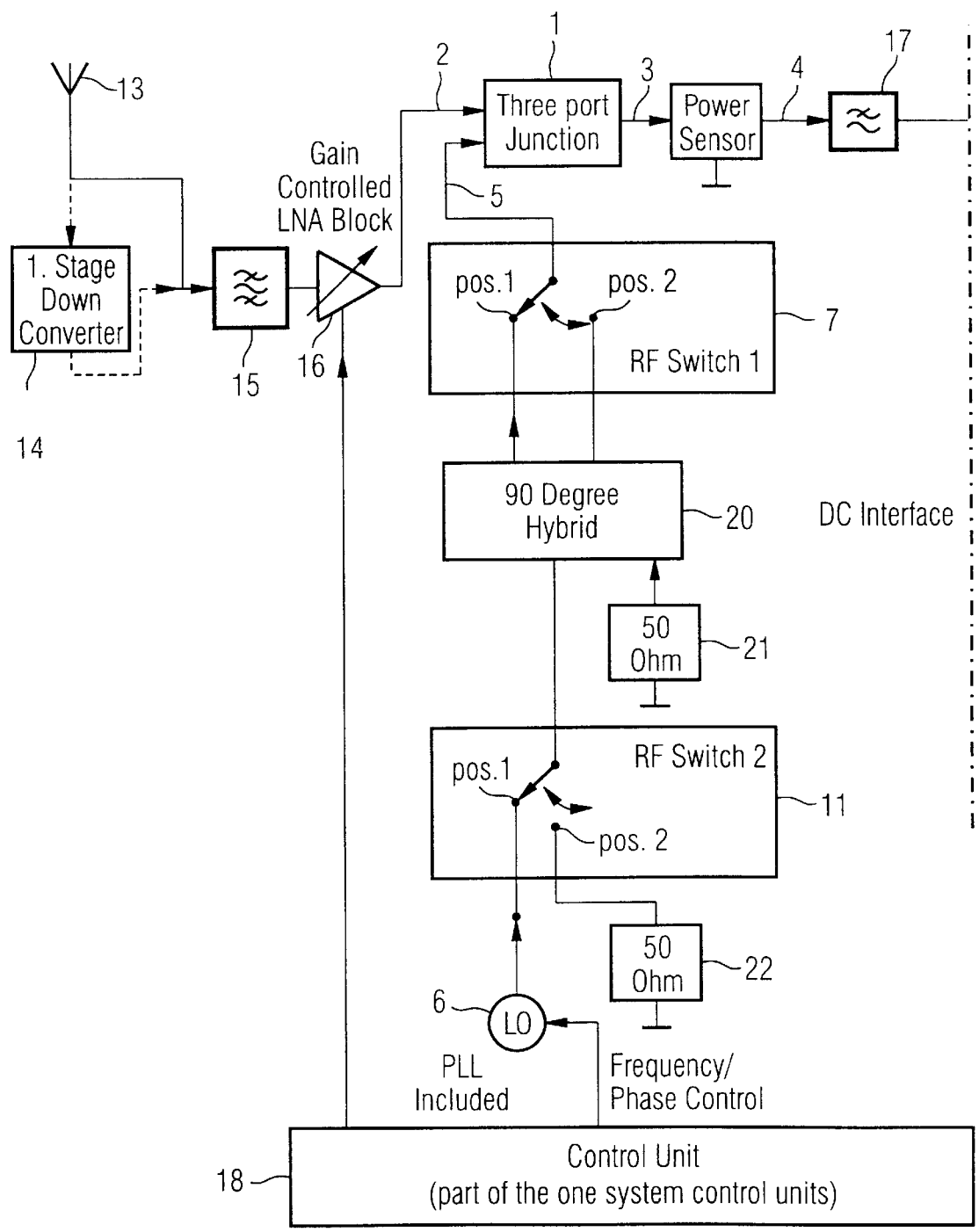
Figure 8:
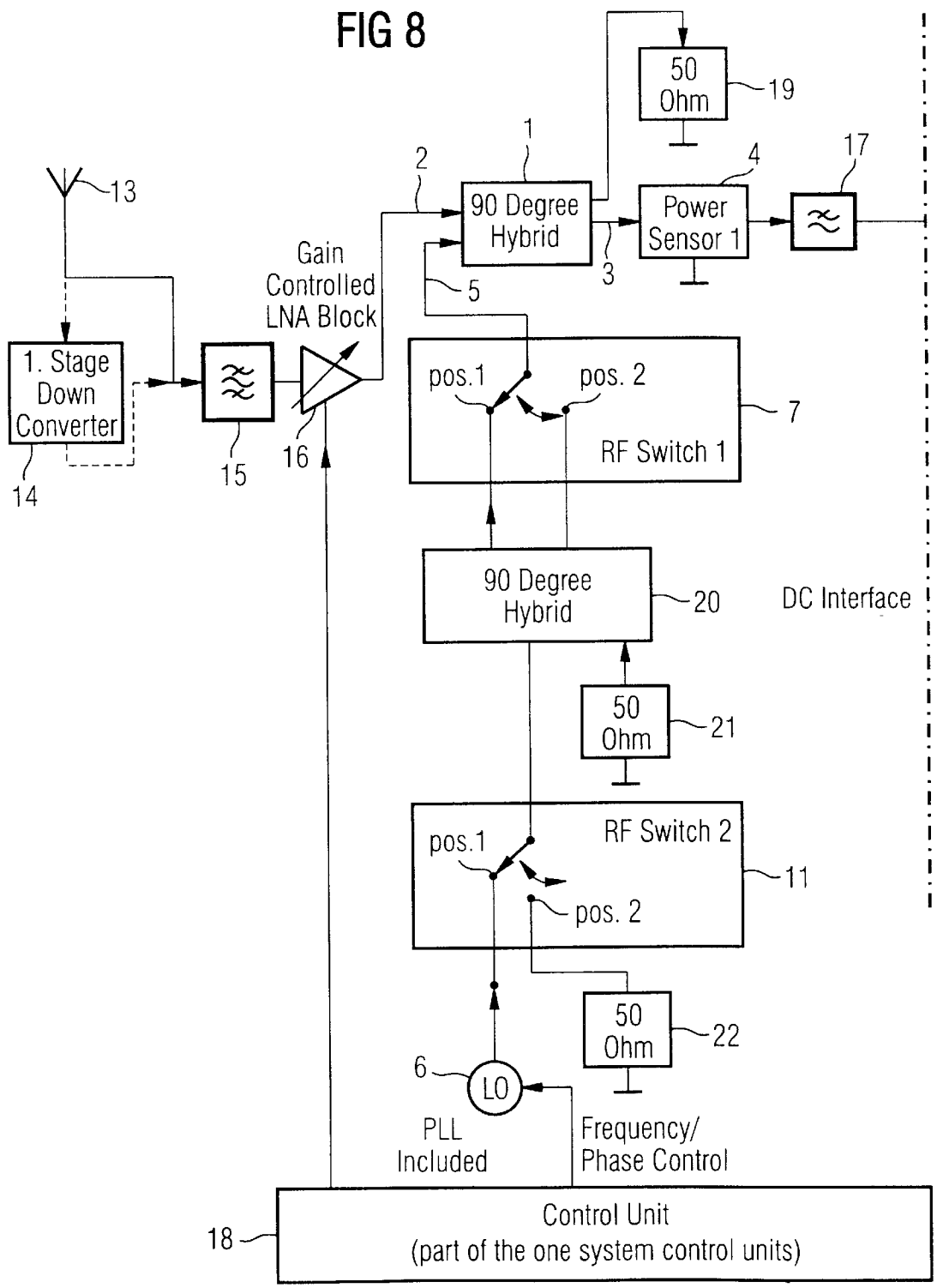
Figure 9:
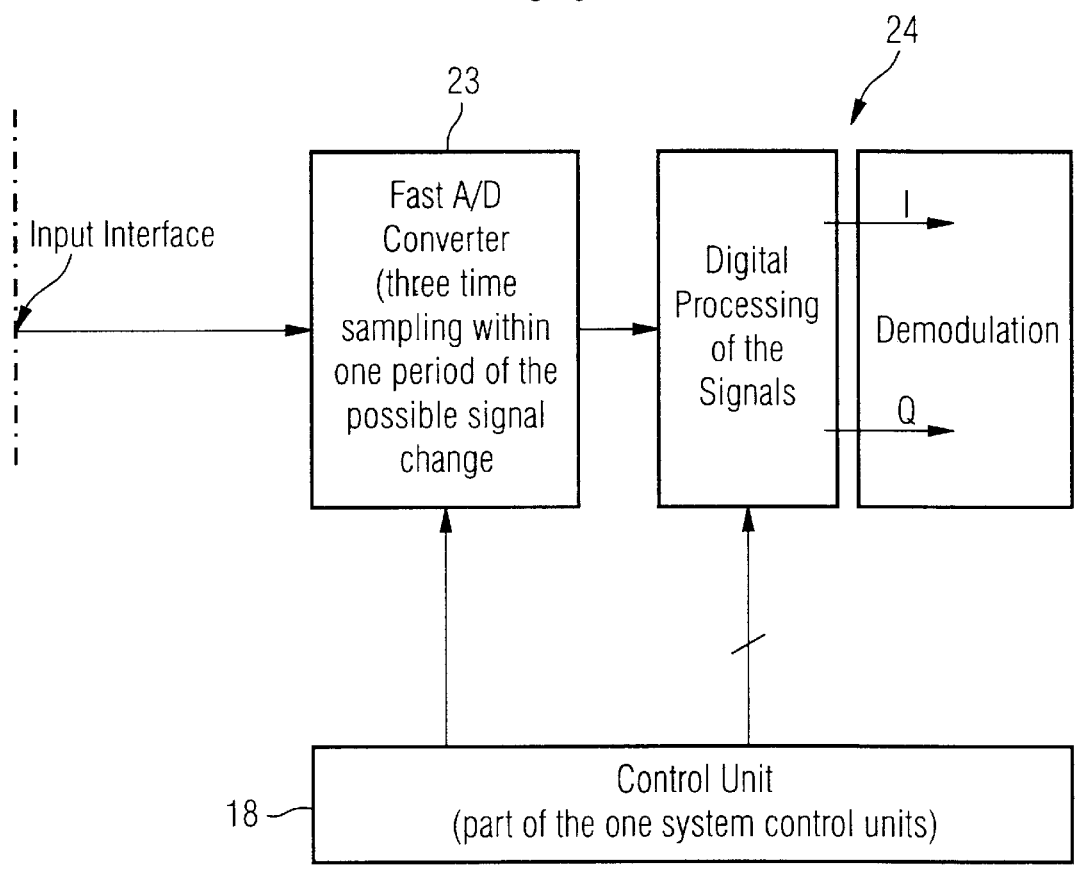
Figure 10:
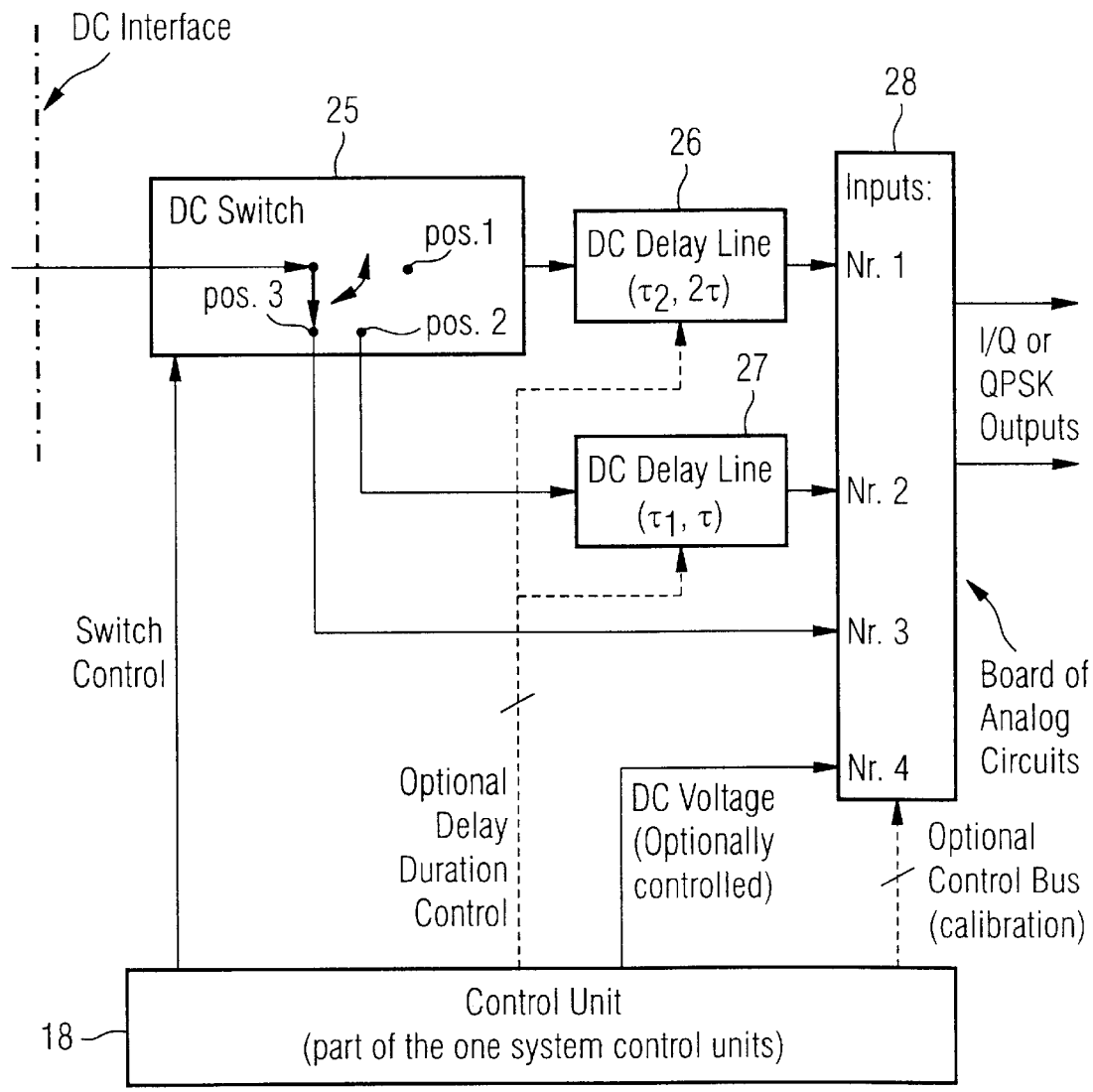
Figure 11:
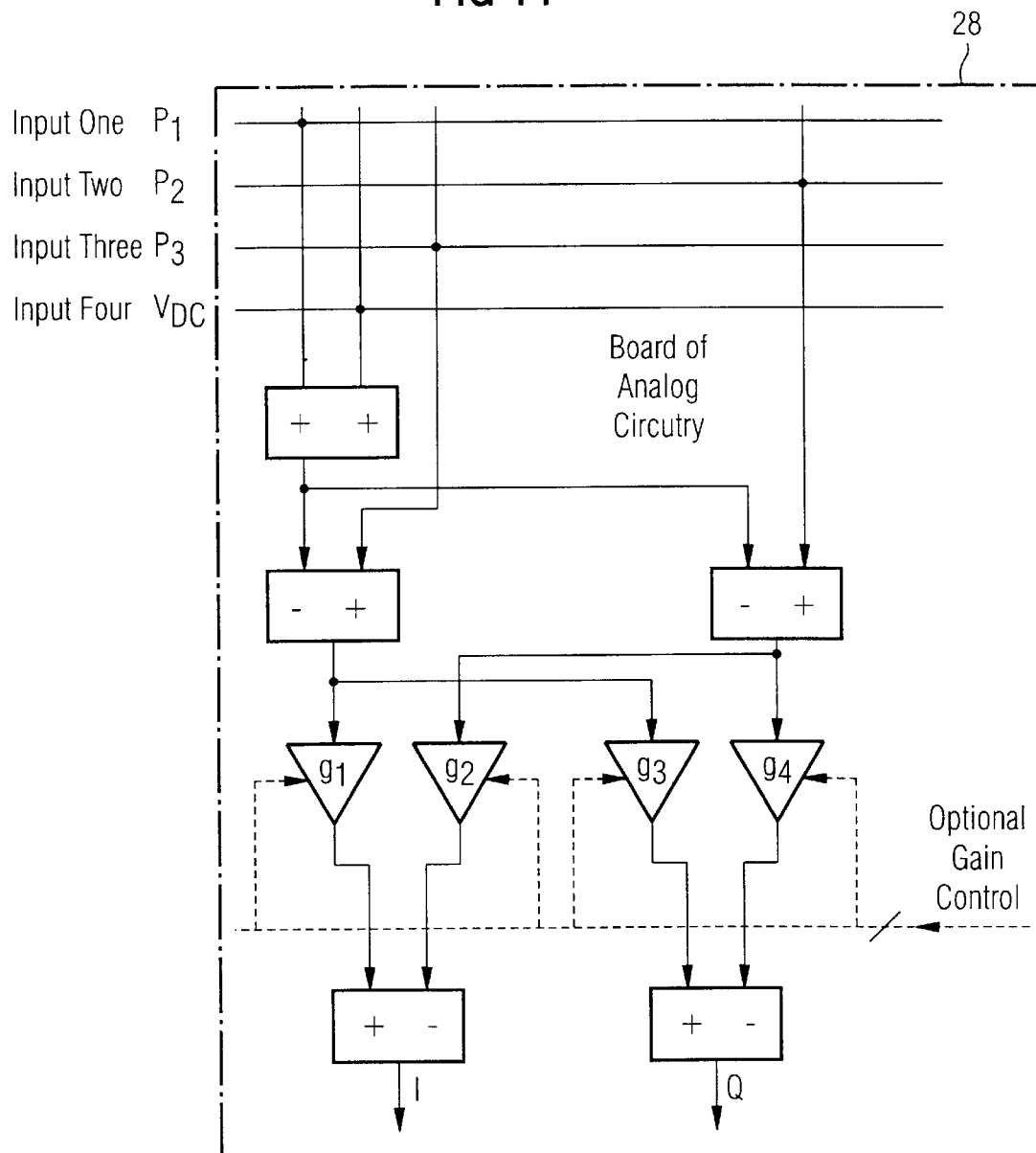
Figure 15:
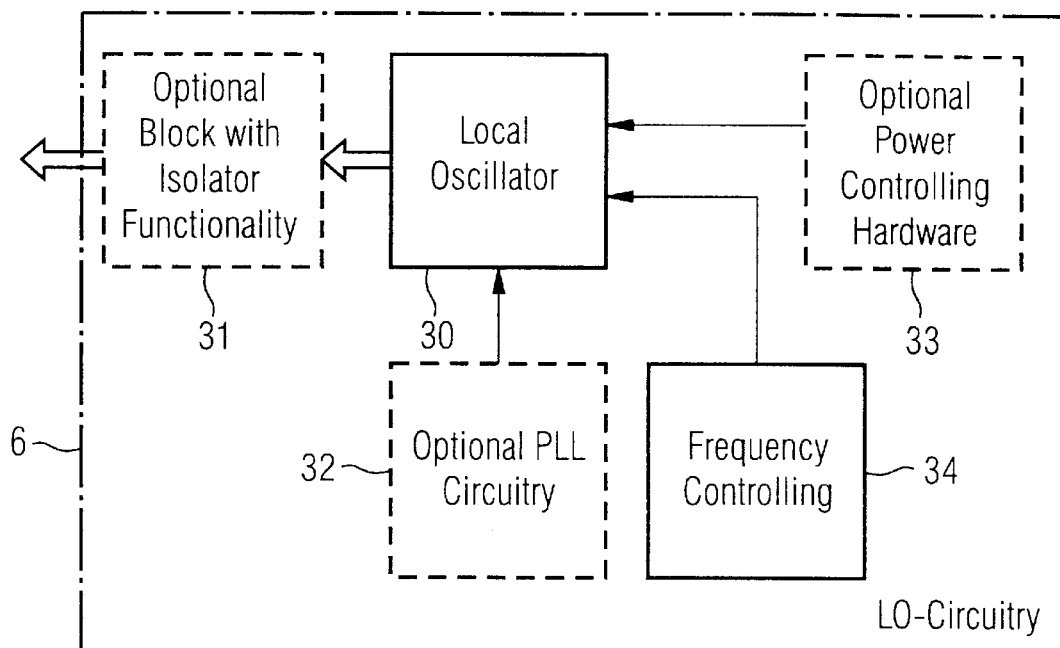

FIG. 1 generally shows a three-port junction receiver topology according to the present invention, FIG. 2 shows a more detailed representation of the three-port junction receiver topology of FIG. 1, FIG. 3 shows a direct receiver comprising a three-port function implemented by a 90° hybrid circuit, FIG. 4 shows a direct receiver according to a further embodiment of the present invention, according to which one absorptive RF switch is used, FIG. 5 shows a further development of the embodiment according to FIG. 4, wherein the further development according to FIG. 5 one absorptive RF switch and a 90° hybrid circuit is used, FIG. 6 shows a further embodiment of a direct receiver according to the present invention, according to which embodiment one absorptive RF switch is used and a 90° hybrid circuit is used at the local oscillator side, FIG. 7 shows a further embodiment of the present invention, according to which embodiment a 90° hybrid circuit is used as source for a phase shifted signal and both RF switches on the input side of the three-port junction device have two switching states, FIG. 8 shows a further embodiment of the present invention, according to which embodiment a 90° hybrid circuit is used as source for a phase shifted signal, a first RF switch has two switching states and another 90° hybrid circuit is used instead of the three-port junction device according to FIG. 7, FIG. 9 shows the A/D conversion circuitry of DC values output by the power sensor in case of a digital further processing of the output signal of the power sensor, FIG. 10 shows the analog processing of the DC signal output from the power sensor and the supply of the analog I/Q signals for further processing, FIG. 11 shows a circuitry of the analog circuit board generating analog I/Q output signals, FIG. 12 shows a functional description of the ideal three-port junction and one possible realization, FIG. 13 shows the modification of a four-port junction device such as to have the function of a three-port junction device, FIG. 14 shows different implementations for three-port junction devices, FIG. 15 shows in functional blocks the LO circuitry according to the present invention, FIG. 16 shows schematically the power sensor block, and FIG. 17 to FIG. 25 show simulation results originating from a simulation of the technique proposed by the present invention.

The general concept of the present invention will now be explained with reference to FIG. 1.

A digital modulated RF signal is received by means of an antenna 13 over the air. Optionally the received RF signal can be downconverted in a first stage downconverter 14 to generate a signal modulated on an intermediate frequency. As it has already been stated, said first stage downconverter 14 is only an optional block. Either the signal from the first stage downconverter 14 or directly this RF signal from the antenna 13 is passed through a band pass filter 15. The output signal of the filter 15 is supplied to a low noise amplifier 16, whose gain is controlled by means of a control signal from a control unit 18. The output of the low noise amplifier 16 is fed to a first input of a passive linear three-port circuitry 1. The passive linear three-port circuitry 1 comprises three active ports, i.e. the RF signal input 2, a further RF input 5 as well as an output port 3. The three-port circuitry can comprise further ports which are for example terminated with impedance matching resistors to ground and which therefore are not regarded as active ports.

The output of the passive linear three-port circuitry 1 at the third port 3 is supplied to a power sensor 4 and then to a DC interface for further processing, wherein between the power sensor 4 and the DC interface a low pass filter 17 is provided.

The passive linear three-port circuitry 1 comprises at least one switch and at least one passive sub-structure with a phase shifting functionality according to the present embodiment. At the second RF input 5 of the linear three-port circuitry 1 an output signal originating from a local oscillator 6 is fed in. The frequency and the phase of the local oscillator 6 is also controlled by means of the control unit 18. The topology according to the present invention therefore comprises a passive linear three-port high-frequency circuitry 1 having two RF input ports 2, 5 and one output port 3 attached to the power sensor 4.

FIG. 2 shows an option for a realization of the general concept of FIG. 1.

Again the frequency and the phase of the local oscillator 6 are controlled by the control unit 18. The high-frequency signal from the local oscillator 6 is supplied to a RF switch 11 having two switching positions. In the first position of the RF switch 11 the RF signal of the local oscillator 6 is passed to a first phase shifter 9 and the phase shifted signal is fed to a second contact of a RF switch 7.

In the second switching position of the RF switch 11the LO high-frequency signal is either passed directly to a third switching position of the RF switch 7 or passed through a second phase shifter 10 before it is fed to said third switching position of the RF switch 7. The phase shifting amount generated by the second phase shifter 10 is different from the phase shifting amount generated by the first phase shifter 9.

As it can be seen from FIG. 2, the RF switch 7 has three switching positions, wherein, as already explained, the position 2 and 3 are respectively supplied with a RF signal originating from the local oscillator 6. The first switching position of the RF switch 7 is connecting to the ground potential 8 by means of a resistor 12 with a system impedance value of 50 Ohm.

According to the embodiment shown in FIG. 2, the three-port direct receiver comprises a three-port junction device 1, two RF switches 7, 11 and at least one phase shifter 9, 10. The power sensor 4, the switches 7, 11 and the phase shifters 91, 10 are matched to the system impedance of 50 Ohm.

The RF switches 7, 11 have a maximum switching frequency such that they are adapted to switch at least three times (switch 7) and two times (switch 11), respectively, per modulation state duration (duration of a modulation bit) of the received digital modulated input signal. The modulation state duration (duration of a modulation bit) is a time in which there is no change of the modulation state in the RF signal.

Under condition that the duration of the modulation state is T and that the time for changing a switch position from position 1 to position 2 of the switch 7 is $\tau_1$, the time required to switch from position 2 from position 3 of the switch 7 is $\tau_2$ and this switching time $\tau_2$ is the same time at a time $\tau_1$ required to switch from position 1 to position 2 of the switch 7, then the minimum switching time is $\tau_1 = \tau_2 = T/3.$ The operation of the direct receiver according to the present invention is the following: At the beginning, i.e. the start of a modulation state, the first RF switch 7 is controlled to be in the switching position 1. At the input of the power sensor therefore in this state there is only information about the RF power level of the signal received from the antenna 13 and fed to the first RF input 2 of the three-port circuitry 1. The RF power level is weighted with some coefficients predetermined by the internal structure of the three-port circuitry 1. The resulting DC signal output from the power sensor 4 is passed through the low pass filter 17 before it is passed to a DC interface which we explained later on.

In the second time period (second third of the modulation state duration (duration of a modulation bit) in case of a equal distribution of the switching times), the switch 7 is controlled to be in the switching position 2 and the RF switch 11 is controlled to be in the switching position 2 meaning that the RF signal originating from the local oscillator 6 is passed through the phase shifter 9 and fed to the three-port junction circuitry 1. In the three-port circuitry 1 said RF signal originating from the local oscillator 6 and fed to the input 5 of the three-port circuitry 1 is combined with a received RF signal input at the first RF input 2 of the three-port circuitry 1 and the resulting combined RF signal is input to the power sensor 4.

In the third time period (third third of the modulation state duration (duration of a modulation bit)), the switch 7 is controlled to be in the switching position 3 and the RP switch 11 is controlled to be in the switching position 1 meaning that the RF signal originating from the local oscillator 6 is passed directly (or through the phase shifter 10 having a different phase shift compared to the phase shifter 9) to the input of the three-port junction circuitry 1. This signal is therefore combined without any phase shift (or with a phase shift different to the phase shift effected in the second third of the modulation state duration (duration of a modulation bit) as set forth above) to the received RF signal input at the first RF input 2 of the linear three-port junction circuitry 1 and the combined resulting signal is supplied to the power sensor 4.

Due to the duration of the modulation state it can be assumed that the RF signal received has the same magnitude and phase during the above-mentioned switching processes, wherein the magnitude and phase can only be influenced by noise.

Due to the switching operation, information of three different power levels is generated in a time multiplex manner and the resulting DC signals are supplied to the DC interface, which will be explained later on. The detection time (response time) of the power sensor 4 is such that it is at least three times faster as modulation state time of the received digital modulated RF signal fed to the input 2 of the three-port circuitry 1.

FIG. 3 shows a modification of the topology shown in FIG. 2. According to the embodiment of FIG. 3, the three-port junction device 1 is a 90° hybrid circuit with three active ports having the function of the ports as explained with reference to FIG. 2 and a fourth port which is connected to ground potential by means of a 50 Ohm resistor 19. A 90° hybrid provides for a LO/RF isolation.

FIG. 4 shows further modification of the central idea of the present invention. According to the embodiment of FIG. 4 one absorptive switch 7 is used and instead of the second RF switch 11 of FIG. 2 a power divider 11' is used. The replacement of the second switch 11 by the power divider 11' reduces the complexity and the costs of the old device of FIG. 2; however, the power of the LO signal is partly lost resulting in a higher power consumption.

FIG. 5 shows a further embodiment of the present invention, according to which the three-port junction circuitry 1 of FIG. 4 is replaced by a 90° hybrid circuit with a passive port which is connected to ground potential by means of a resistor 21 with a resistance value of 50 Ohm (impedance) providing LO/RF isolation.

FIG. 6 shows a further embodiment of the present invention according to which a 90° hybrid circuit 20 provides for the supply of two RF signals which are phase shifted relatively to each other and originate from the local oscillator 6. One port of the 90° hybrid circuit 20 is connected to ground potential by means of a resistor 21 with a resistance value of 50 Ohm. The two output RF signals of the 90° hybrid circuit 20, which are phase shifted by 90° degrees to each other, are supplied to the absorptive switch 7.

FIG. 7 shows a modification of the embodiment of FIG. 6. However, according to the embodiment of FIG. 7, the second RF switch 11 is connected between the local oscillator 6 and the 90° hybrid circuit 20 such that the RF switch 7 does not need to be an absorptive switch and correspondingly no power of the output signal of the local oscillator 6 gets lost.

In the modification according to FIG. 8 the three-port junction is a 90° hybrid circuit 1 providing for a LO/RF isolation. It should be noted that the three-port junction devices of FIGS. 2 and 4 can be realized either by a 90° or a 180° hybrid circuit by a plurality of realization options. In any case the target is to provide for a LO/RF isolation function.

In the following different implementations of the DC interface at the output side of the power sensor 4 will be explained.

In FIG. 9 a digital processing of the low-pass filtered output signal of the power sensor 4 is shown. The low-pass filtered output signal of the power sensor 4 therefore is A/D converted in a fast A/D converter 23, digitized data are processed by a digital processing unit 24 and the I/Q components or demodulated modulation states are supplied to the output. The A/D converter 23 has a sampling rate which is at least three times faster than the sampling rate of one A/D converter of a classic analog I/Q demodulator. The digital processing unit 24, which is controlled along with the A/D converter by the control unit 18, can either calculate as shown I/Q component output signals and provide them to a demodulator (not shown), or the demodulation is also formed within the digital processing unit 24 performing a direct demodulation of the input signals in this case.

FIG. 10 shows an alternative embodiment to the implementation of FIG. 9. According to the embodiment of FIG. 10, the analog I/Q signals are extracted by means of an analog processing of the DC signal output from the power sensor 4. As shown in FIG. 10, the low pass filtered output signal of the power sensor 4 is supplied to a fast DC switch 25. The DC switch 25, which is also controlled by the control unit 18, receives the same switching control signals as the RF switches 7, 11 as shown in FIG. 2. With other words, the DC signal originating from the power sensor 4 is multiplexed such as to be supplied with three different delays to an analog processing board 28.

The DC switch 25, which is controlled synchronously to the RF switches 7, 11 as shown in FIG. 2, has two switching positions to supply the received DC signals originating from the power sensor 4 in a time multiplex manner to the analog processing board 28 by means of a plurality of DC delay lines 26, 27. Optionally, additionally to the DC signals fed to inputs No.1, No.2, and No.3 of the analog processing board 28, a DC voltage controlled by the control unit 18 can be fed to an input No.4 of the analog processing board 28.

Optionally, the analog processing board 28 can furthermore be calibrated by the control unit 18.

The two DC delay lines 26, 27 have different delays, i.e. delays corresponding to the period $\tau_1$, and $\tau_1+\tau_2$ which can be T/3 and 2T/3 in the case of modulation state time duration. The three signals output in a time multiplex manner from the DC switch 25 are supplied optionally together with a DC voltage controlled by the control unit 18 to the analog circuitry of the analog processing board 28. The output signals of the analog circuit board are either I/Q component signals or directly QPSK output signals. In the case of I/Q component signals the analog signals can be converted into digital signals and be provided to a demodulator.

FIG. 11 shows in a more detailed representation the internal structure of the analog circuitry board 28 of FIG. 10.

The DC gain values of the DC amplifiers as shown in FIG. 11 are specified in the following equations 19–22, wherein special case values are given in the equations 23 and 24 below.

In the following a mathematical description of the method according to the present invention is given. Table 2 gives an explanation of the variables used.

$$s_1 = S_1 e^{j\varphi_1}; \quad s_2 = S_2 e^{j\varphi_2}; \quad \rho = \frac{S_1}{S_2}; \quad \Delta\varphi = \varphi_1 - \varphi_2 \quad (1)$$

$$s = \frac{s_1}{s_2} = \rho e^{j\Delta\varphi}; \quad I = \rho\cos\Delta\varphi \quad Q = \rho\sin\Delta\varphi \quad (2)$$

$$v_1 = c_1 s_1; \quad v_2 = c_1 s_1 + c_2 s_2 e^{-j\theta_1}; \quad v_3 = c_1 s_2 e^{-j\theta_2} \quad (3)$$

$$c_1 = k_1 e^{j\psi_1}; \quad c_2 = k_2 e^{j\psi_2}; \quad k = \frac{k_1}{k_2} \quad (4)$$

$$v_1 = k_1 S_1 e^{j(\phi_1+\psi_1)} \quad (5)$$

$$v_2 = k_1 S_1 e^{j(\phi_1+\psi_1)} + k_2 S_2 e^{j(\phi_2+\psi_2-\theta_1)} = e^{j(\phi_1+\psi_1)}[k_1 S_1 + k_2 S_2 e^{j(\phi_2-\phi_1+\psi_1-\theta_1)}] \quad (6)$$

$$v_2 = k_1 S_1 e^{j(\phi_1+\psi_1)} + k_2 S_2 e^{j(\phi_2+\psi_2-\theta_2)} = e^{j(\phi_1+\psi_1)}[k_1 S_1 + k_2 S_2 e^{j(\phi_2-\phi_1+\psi_1-\theta_2)}] \quad (7)$$

$$\Delta\theta_1 = \theta_1 - \psi_2 + \psi_1; \quad \Delta\theta_2 = \theta_2 - \psi_2 + \psi_1; \quad (8)$$

$$P_1 = C \cdot |v_1|^2 = Ck^2 S_1^2 \quad (9)$$

$$P_2 = C \cdot |v_2|^2 = C[k_1^2 S_1^2 + k_2^2 S_2^2 + 2k_1 k_2 S_1 S_2 \cos(\Delta\phi - \Delta\theta_1)] \quad (10)$$

$$P_3 = C \cdot |v_3|^2 = C[k_1^2 S_1^2 + k_2^2 S_2^2 + 2k_1 k_2 S_1 S_2 \cos(\Delta\phi - \Delta\theta_2)] \quad (11)$$

$$P_2 = P_1 + V_{DC} + 2kV_{DC}\rho(\cos\Delta\phi\cos\Delta\theta_1 - \sin\Delta\phi\sin\Delta\theta_1) \quad (12)$$

$$P_3 = P_1 + V_{DC} + 2kV_{DC}\rho(\cos\Delta\phi\cos\Delta\theta_2 - \sin\Delta\phi\sin\Delta\theta_2) \quad (13)$$

$$V_{DC} = k_2^2 P_{LO} P_{LO} = C \cdot |s_2|^2 \quad (14)$$

$$I\cos\Delta\theta_1 - Q\sin\Delta\theta_1 = \frac{P_2 - P_1 - V_{DC}}{2kV_{DC}} \quad (15)$$

$$I\cos\Delta\theta_2 - Q\sin\Delta\theta_2 = \frac{P_3 - P_1 - V_{DC}}{2kV_{DC}} \quad (16)$$

$$I = \frac{(P_3 - P_1 - V_{DC})\sin\Delta\theta_1 - (P_2 - P_1 - V_{DC})\sin\Delta\theta_2}{2kV_{DC}\sin(\Delta\theta_1 - \Delta\theta_2)} \quad (17)$$

$$Q = \frac{(P_3 - P_1 - V_{DC})\cos\Delta\theta_1 - (P_2 - P_1 - V_{DC})\cos\Delta\theta_2}{2kV_{DC}\sin(\Delta\theta_1 - \Delta\theta_2)} \quad (18)$$

$$I = g_1(P_3 - P_1 - V_{DC}) - g_2(P_2 - P_1 - V_{DC}) \quad (19)$$

$$Q = g_3(P_3 - P_1 - V_{DC}) - g_4(P_2 - P_1 - V_{DC}) \quad (20)$$

$$g_1 = \frac{\sin\Delta\theta_1}{2kV_{DC}\sin(\Delta\theta_1 - \Delta\theta_2)}; \quad g_2 = \frac{\sin\Delta\theta_2}{2kV_{DC}\sin(\Delta\theta_1 - \Delta\theta_2)} \quad (21)$$

$$g_3 = \frac{\cos\Delta\theta_1}{2kV_{DC}\sin(\Delta\theta_1 - \Delta\theta_2)}; \quad g_4 = \frac{\cos\Delta\theta_2}{2kV_{DC}\sin(\Delta\theta_1 - \Delta\theta_2)} \quad (22)$$

in special case:

$$k_1 = k_2; \; k=1; \; \Delta\theta_1 = 90°; \; \Delta\theta_2 = 0° \rightarrow \quad (23)$$

$$I = \frac{P_3 - P_1 - V_{DC}}{2V_{DC}}; \quad Q = \frac{P_1 + V_{DC} - P_2}{2V_{DC}} \quad (24)$$

TABLE 2

Legend of Variables

| | |
|---|---|
| $S_1$ | RF signal to be I/Q demodulated, or further processed in the digital domain by digital processing unit |
| $S_2$ | LO (second RF signal), having constant amplitude and constant phase, which are known. |
| $\phi_1$ | phase of the signal one (RF) |
| $\phi_2$ | phase of the signal two (LO) |
| T | Symbol Duration (meaning signal does not change magnitude and phase during this time), which is also called modulation bit duration |
| $\tau_1, \tau_2$ | Delay of the DC Delay Line Entities |
| $c_1$ | complex transfer function of the signal $S_1$ to the power detector |
| $c_2$ | complex transfer function of the signal $S_2$ to the power detector |
| $v_1$ | signal which approaches power sensor at time $t = t_0$ |
| $v_2$ | signal which approaches power sensor at time $t = t_0 + \tau_1$ |
| $v_3$ | signal which approaches power sensor at time $t = t_0 + \tau_1 + \tau_2$ |
| $k_1$ | magnitude of the complex transfer function $c_1$ |
| $k_2$ | magnitude of the complex transfer function $c_2$ |
| $\theta_1$ | electrical phase shift provided by phase shifter one |
| $\theta_2$ | electrical phase shift provided by optional phase shifter two |
| $P_{RF}$ | RF power |
| $P_{LO}$ | LO power |
| $V_{DC}$ | Constant value having information about LO power level |
| C | real constant |
| $P_1$ | Power level detected as after power detector, at time $t = t_0$ |
| $P_2$ | Power level detected as after power detector, at time $t = t_0 + \tau_1$ |
| $P_3$ | Power level detected as after power detector, at time $t = t_0 + \tau_1 + \tau_2$ |
| $g_1, g_2, g_3, g_4$ | Gain of the DC amplifiers (optionally to be controlled by the control unit 18), which are part of the Board of the analog circuits. |

It is to be noted that the gain control of the gain coefficients $g_1$–$g_4$ as well as the control of the DC delay entities by the control unit 18 is optional and provides for calibration features.

Figure 12A:
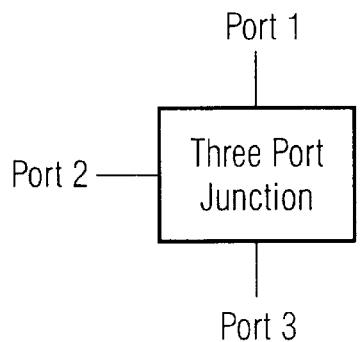
Figure 12B:
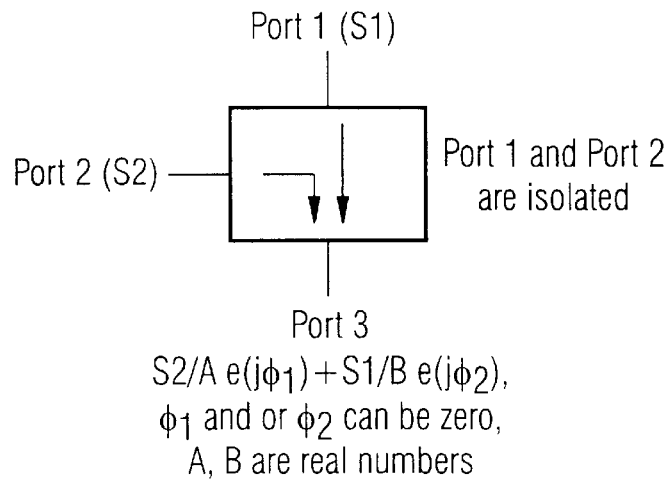

FIG. 12A and 12B show an ideal functional description and a realization option of a three-port junction device used in the above equations.

Figure 12C:
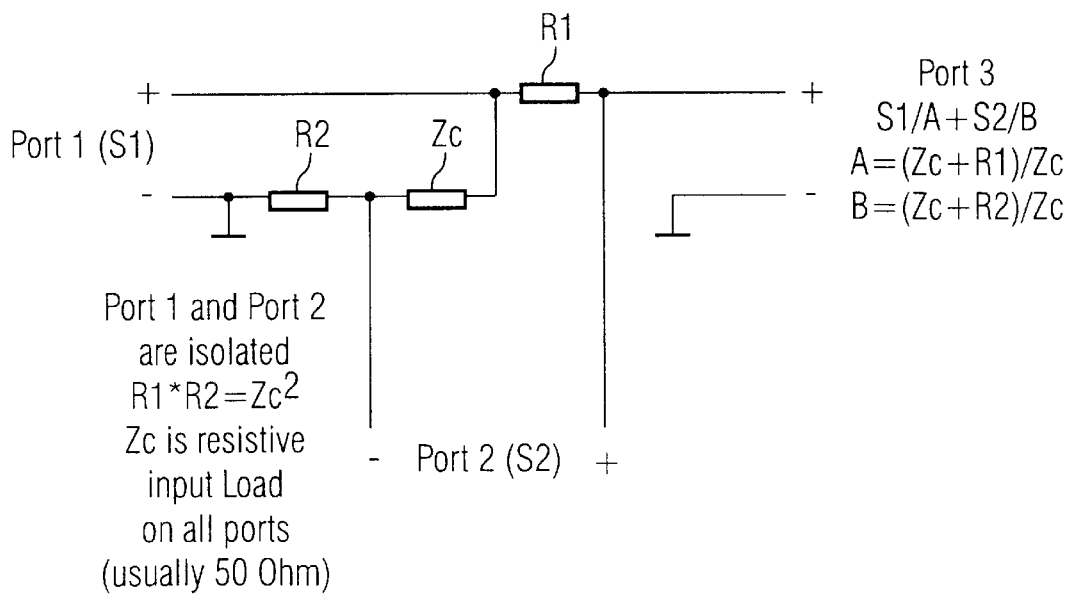

In the following, implementation possibilities for three-port junction devices will be shown and explained. FIG. 12C thereby shows an implementation based on resistors.

Port 1 and port 2 thereby are isolated. The values of R1 and R2 are chosen such that the following equation $$R1 \times R2 = Zc^2$$

is satisfied. Zc thereby is the resistive input corresponding to the load on all ports, which is usually 50 Ohm.

The signal at the output port 3 can be shown by the following equation:

$$S3 = S1/A + S2/B, \text{ wherein}$$

$$A = (Zc+R1)/Zc, \text{ and}$$

$$B = (Zc+R2)/Zc.$$

Note that S1 and S2 are the signals fed to the RF input ports 1 and 2, respectively.

Figure 13A:
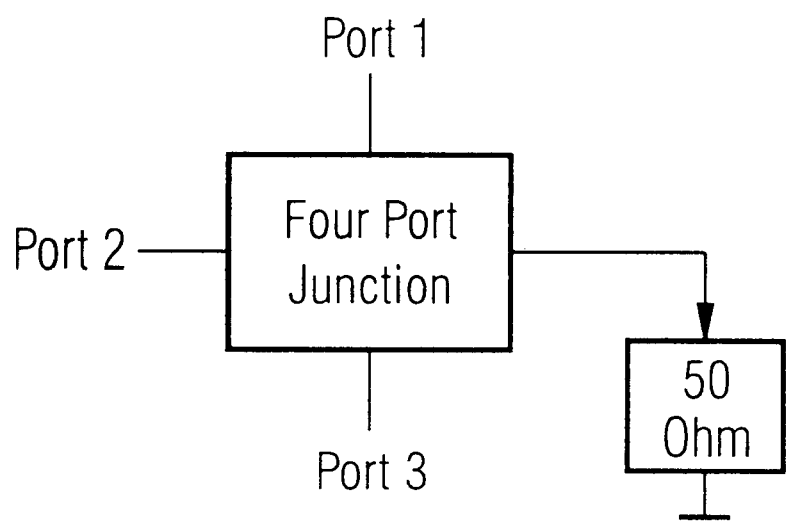

FIG. 13A shows schematically the realization of a three-port junction device wherein one port of a four-port junction device is attached to the system reference impedance (usually 50 Ohm).

The following S-matrix of the four-port junction shown in FIG. 13A shows the theoretical transfer function of such a four-port junction device:

$$\begin{bmatrix} 0 & s_{12} & 0 & s_{14} \\ s_{12} & 0 & s_{23} & 0 \\ 0 & s_{23} & 0 & s_{34} \\ s_{14} & 0 & s_{34} & 0 \end{bmatrix}$$

$$s_{12} = s_{34} = a; \quad s_{14} = s_{23} = b;$$

$$|a|^2 + |b|^2 = 1$$

One port thereby is matched to the reference impedance. Furthermore it is to be noted that ports 1 and 3 are isolated and furthermore ports 2 and 4 are isolated. The RF signals can be fed to the ports 1 and 3. One of the ports 2 or 4 can be connected to a matched power sensor. The remaining port is terminated by a system reference impedance.

Figure 13B:
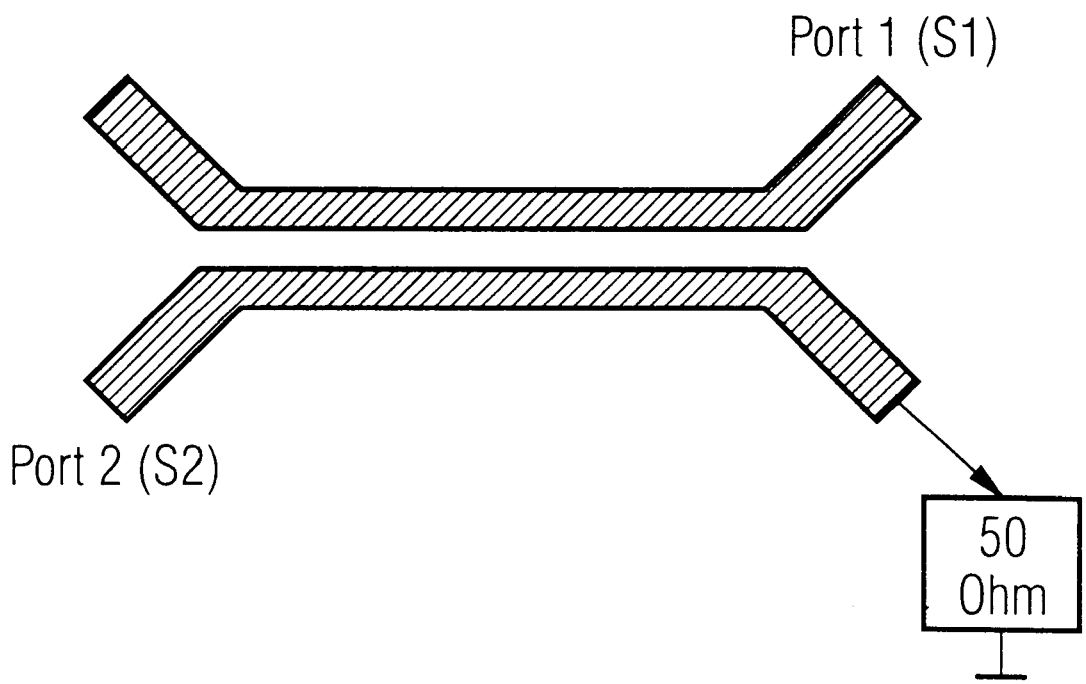

FIG. 13B shows an implementation of a four-port junction device with a three-port junction functionality.

Practical realizations of the three-port junction device are shown in FIG. 14A–FIG. 14F of the enclosed drawings. The topologies as shown in FIG. 14C, 14D, 14E and 14F can be realized with an additional fourth-port which is terminated by the system reference impedance (usually 50 Ohm). Furthermore it is to be noted that the angles between the ports of the topologies as shown in FIG. 14C, 14D, 14E and 14F can be optimized in order to achieve isolation ports and a simultaneous matching.

FIG. 15 shows the internal structure of the local oscillator block 6. Said oscillator block 6 comprises a local oscillator 30, an optional block 31 with isolator functionality, an optional power controlling hardware 33, a frequency controlling block 34 as well as an optional PLL circuitry 32. Regarding the function of the LO block as shown in FIG. 15, reference is made to the European Patent Application 97 122 438.1 (see FIG. 13 and the corresponding description).

FIG. 16 shows the subelements of the power sensor 4. The power sensor 4 therefore comprises a detector diodes 37 as a temperature compensated power sensor which can be implemented by a FET structure. The power sensor block 4 furthermore comprises a optional matching network 35 and an optional analog compensation hardware for non-linear behavior. Regarding the function of the power sensor block 6 as shown in FIG. 16, reference is made to FIG. 11 and the corresponding description of the above-mentioned European Patent Application 97 122 438.1.

FIG. 17 to FIG. 25 shows simulation results obtained by applying the above three-port direct receiver technology according to the present invention. In order to verify the proposed method and receiver technique, a simple simulation has been performed. In order to see the general effects of the present invention, the following conditions have been used for the simulation:

power sensors are implemented by detector diodes which are working linearly and have input impedance with the same tolerances (reactive part considered as matched) as the discrete resistors of the assembly, the imbalances of the three-port junction are 10% (equivalent to 20% resistor deviation in opposite directions), it is assumed that noise (in magnitude and phase) is changing randomly in three consecutive time steps, wherein the sum of three time steps is giving a time during which the received modulation state is constant, only one phase shift of 90° is assumed, 200 events are printed in the diagrams.

The following different options have been simulated:
a) 16 QAM modulated signal is input to a direct receiver
b) the ideal performance of the AGC is that the average signal power level=10 dB under LO level,
c) AGC is not working (or works badly) and the average signal power level is the same as the LO level, and
d) no AGC and average signal power level=20 dB under LO level In all cases a 8, 10 and 12 bit AGC is considered, which is positioned directly on the DC interface. The maximum value for detection is set for the case when the RF level is the same as the LO level. It is to be noted that the cases b), c), and d) as set forth above can also be interpreted in the way that non-constant modulation is applied which RF power has 40 dB range, wherein the output back-off of the transceiver is 10 dB and the AGB works perfectly.

According to FIG. 6 the offset of the detected signals may be compensated by a calibration procedure. In the case of (n)QAM modulated signals or (n)PSK modulated signals only averaging the test signals is sufficient for a compensation.

A calibration can be performed by feeding predefined sequences which can be n(PSK) modulated signals to the RF input port of the three port junction device according to the present invention.

What is claimed is:

1. Direct receiver for digital modulated RF signals, comprising one passive three port circuitry (1), wherein
    a first port (2) of the passive three port circuitry (1) is supplied with a received digital modulated RF signal,
    a second port (3) of the passive three port circuitry (1) is connected to a power sensor (4), wherein the power sensor (4) generates an output signal, and
    input selection means (7) selectively input one of a plurality of predetermined signals into a third port (5) of the passive three port circuitry (1),
    whereby the input selection means includes at least one switch having at least two positions.

2. Direct receiver according to claim 1,
characterized in that
    a local oscillator (6) is provided being selectively connectable with the third port (5) of the passive three port circuitry (1) by means of the input selection means (7).

3. Direct receiver for digital modulated RF signals, comprising one passive three port circuitry (1), wherein
    a first port (2) of the passive three port circuitry (1) is supplied with a received digital modulated RF signal,
    a second port (3) of the passive three port circuitry (1) is connected to a power sensor (4), wherein the power sensor (4) generates an output signal, and
    input selection means (7) selectively input one of a plurality of predetermined signals into a third port (5) of the passive three port circuitry (1),
    whereby the input selection means is a switch (7) having at least two positions and selectively connecting
        an output signal originating from the local oscillator (6), or
        a ground potential (8) with the third port (5) of the passive three port circuitry (1).

4. Direct receiver according to claim 3,
characterized in that
    said switch (7) has three positions, wherein
        in a first position a first output of the local oscillator (6) is connected to the third port (5) of the passive three port circuitry (1),
        in a second position a second output of the local oscillator (6) is connected to the third port (5) of the passive three port circuitry (1), and
        in a third position said ground potential (8) is connected to the third port (5) of the passive three port circuitry (1),
    wherein the second output of the local oscillator is phase shifted by at least one phase shifter (9, 10) relatively to the first output of the local oscillator (6).

5. Direct receiver according to claim 4,
characterized in that
    a resistor (12) is connected between said ground potential (8) and said switch (7).

6. Direct receiver according to claim 3,
characterized in that
    the switch (7) has a maximum switching frequency such that it is adapted to switch at least three times per state duration of the received digital modulated RF signal.

7. Direct receiver according to claim 4,
characterized in that
    a second switch (11) is provided for routing an output of the local oscillator (6) to one of a plurality of phase shifter (9, 10), wherein each of said plurality of phase shifter (9, 10) provides for a different phase shift.

8. Direct receiver according to claim 7,
characterized in that
    the second switch (11) has a maximum switching frequency such that it is adapted to switch at least two times per state duration of the received digital modulated RF signal.

9. Direct receiver for digital modulated RF signals, comprising one passive three port circuitry (1), wherein
    a first port (2) of the passive three port circuitry (1) is supplied with a received digital modulated RF signal,
    a second port (3) of the passive three port circuitry (1) is connected to a power sensor (4), wherein the power sensor (4) generates an output signal, and
    input selection means (7) selectively input one of a plurality of predetermined signals into a third port (5) of the passive three port circuitry (1),
    whereby the detection time of the power sensor (4) is less than one third of the state duration of the received digital modulated RF signal.

10. Direct receiver according to claim 1,
characterized in that
    the output of the power sensor (4) is supplied to an analog processing board (28) detecting the I/Q components of the received digital modulated RF signal.

11. Direct receiver according to claim 10,
characterized in that
    the output of the power sensor (4) is supplied to the analog processing board (28) selectively with a predetermined delay (26, 27).

12. Direct receiver for digital modulated RF signals, comprising one passive three port circuitry (1), wherein
    a first port (2) of the passive three port circuitry (1) is supplied with a received digital modulated RF signal,
    a second port (3) of the passive three port circuitry (1) is connected to a power sensor (4), wherein the power sensor (4) generates an output signal, and
    input selection means (7) selectively input one of a plurality of predetermined signals into a third port (5) of the passive three port circuitry (1), whereby the output of the power sensor (4) is supplied to an analog processing board (28) detecting the IQ components of the received digital modulated RF signal, whereby the output of the power sensor (4) is supplied to the analog processing board (28) selectively with a predetermined delay (26, 27), and whereby a DC switch (25) is connected between the power sensor (4) and a plurality of delay lines (26,27), wherein the switching of the DC switch (25) is effected synchronously to the switching of the switch (7).

13. Direct receiver according to claim 1, characterized in that
the output of the power sensor (4) is supplied by means of a A/D-converter (23) to a digital processing unit (24) detecting the I/Q components or demodulated states of the received digital modulated RF signal.

14. Direct receiver according to claim 1, characterized in that
the passive three port circuitry (1) is implemented by discrete components.

15. Direct receiver according to claim 1, characterized in that
the passive three port circuitry (1) is implemented by a distributed technology using microstrip lines.

16. Direct receiver according to claim 1, characterized in that
the passive three port circuitry (1) is implemented by distributed technology using coplanar waveguides.

17. Direct receiver according to claim 1, characterized in that
a low pass filter (17) is provided at the output side of the power sensor (4).

18. Direct receiver according to claim 1, characterized in that
the three-port junction device is realized using a 90° or a 180° hybrid circuit, wherein
one port of the hybrid circuit is terminated by a system impedance.

19. Mobile communications device, characterized in that it comprises a direct receiver according to claim 1.

20. Mobile communications device according to claim 19, characterized in that
it is a mobile terminal of a public or private telecommunications network.

21. Method for calibrating a direct receiver for digital modulated RF signals, comprising one passive three port circuitry (1), wherein
a first port (2) of the passive three port circuitry (1) is supplied with a received digital modulated RF signal,
a second port (3) of the passive three port circuitry (1) is connected to a power sensor (4), wherein the power sensor (4) generates an output signal, and
input selection means (7) selectively input one of a plurality of predetermined signals into a third port (5) of the passive three port circuitry (1),
whereby a RF signal modulated with a predefined known sequence is fed to the first port (2) of the passive three port circuitry (1).

22. Method for directly receiving digital modulated RF signals, comprising the following steps:
supplying a received digital modulated RF signal to a first port (2) of a passive three port circuitry (1),
detecting (4) the power level of a second port (3) of the passive three port circuitry (1) to generate an output signal, and
selectively inputting (7) one of a plurality of predetermined signals to a third port (5) of the passive three port circuitry (1),
whereby the inputted predetermined signal is selected from at least one switch having at least two positions.

23. Method according to claim 22, characterized in that
the step of selectively inputting (7) comprises the step of selectively inputting an output of a local oscillator (6) to the third port (5) of the passive three port circuitry (1).

24. Method for directly receiving digital modulated RF signals, comprising the following steps:
supplying a received digital modulated RF signal to a first port (2) of a passive three port circuitry (1),
detecting (4) the power level of a second port (3) of the passive three port circuitry (1) to generate an output signal, and
selectively inputting (7) one of a plurality of predetermined signals to a third port (5) of the passive three port circuitry (1),
whereby the step of selectively inputting (7) comprises the following steps:
inputting an output signal originating from the local oscillator (6), and
supplying a ground potential (8) to the third port (5) of the passive three port circuitry (1).

25. Method according to claim 24, characterized in that
the step of selectively (7) inputting comprises in a time multiplex manner the following steps:
a) supplying said ground potential (8) to the third port (5) of the passive three port circuitry (1),
b) inputting a first output of the local oscillator (6) to the third port (5) of the passive three port circuitry (1), and
c) inputting a second output of the local oscillator (6) to the third port (5) of the passive three port circuitry (1),
wherein the second output of the local oscillator is phase shifted (9, 10) relatively to the first output of the local oscillator (6).

26. Method according to claim 25, characterized in that
respectively one sequence of steps a), b) and c) is effected per state duration of the received digital modulated RF signal, all these steps are effected during one state duration and the order of the execution of the steps can be modified.

27. Method for directly receiving digital modulated RF signals, comprising the following steps:
supplying a received digital modulated RF signal to a first port (2) of a passive three port circuitry (1),
detecting (4) the power level of a second port (3) of the passive three port circuitry (1) to generate an output signal, and
selectively inputting (7) one of a plurality of predetermined signals to a third port (5) of the passive three port circuitry (1),
whereby the detection time of the power sensor (4) is equal to or less than one third of the state duration of the received digital modulated RF signal.

28. Method according to claim 22, characterized in that
the output of the power sensor (4) is processed in an analog manner (28) to detect the I/Q components of the received digital modulated RF signal.

29. Method for directly receiving digital modulated RF signals, comprising the following steps:
  supplying a received digital modulated RF signal to a first port (2) of a passive three port circuitry (1),
  detecting (4) the power level of a second port (3) of the passive three port circuitry (1) to generate an output signal, and
  selectively inputting (7) one of a plurality of predetermined signals to a third port (5) of the passive three port circuitry (1),
  whereby the output of the power sensor (4) is processed in an analog manner (28) to detect the I/Q components of the received digital modulated RF signal, and
  whereby the output of the power sensor (4) is supplied to an analog processing unit (28) selectively with a predetermined delay (26, 27) out of a number of predefined delays in a time multiplex manner.

30. Method according to claim 29,
characterized in that
  the predetermined delay (26, 27) is changed (25) synchronously to the step of selectively inputting (7) one of a plurality of predetermined signals to a third port (5) of the passive three port circuitry (1).

31. Method according to claim 22,
characterized in that
  the output of the power sensor (4) is A/D-converted (23) and digitally processed (24) to detect the I/Q components of the received digital modulated RF signal.

32. Method according to claim 22,
characterized in that
  the detected (4) power level is low-pass filtered (17).

* * * * *